(12) United States Patent
Inoue et al.

(10) Patent No.: US 11,742,826 B2
(45) Date of Patent: Aug. 29, 2023

(54) QUARTZ ORIENTATION FOR GUIDED SAW DEVICES

(71) Applicant: Qorvo US, Inc., Greensboro, NC (US)

(72) Inventors: Shogo Inoue, Longwood, FL (US); Marc Solal, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/530,650

(22) Filed: Nov. 19, 2021

(65) Prior Publication Data

US 2022/0077838 A1    Mar. 10, 2022

Related U.S. Application Data

(63) Continuation of application No. 16/037,259, filed on Jul. 17, 2018, now Pat. No. 11,206,007.

(60) Provisional application No. 62/575,819, filed on Oct. 23, 2017.

(51) Int. Cl.
  *H03H 9/02*     (2006.01)
  *H03H 3/10*     (2006.01)

(52) U.S. Cl.
  CPC .......... *H03H 9/02551* (2013.01); *H03H 3/10* (2013.01); *H03H 9/0222* (2013.01); *H03H 9/02559* (2013.01); *H03H 9/02574* (2013.01); *H03H 9/02834* (2013.01); *H03H 9/02866* (2013.01)

(58) Field of Classification Search
  CPC ............. H03H 9/02551; H03H 9/0222; H03H 9/02574; H03H 9/02834; H03H 9/02866
  USPC ...... 310/313 R, 313 A, 313 B, 313 C, 313 D
  See application file for complete search history.

(56) References Cited

U.S. PATENT DOCUMENTS

| | | | |
|---|---|---|---|
| 4,600,853 | A | 7/1986 | Whitlock et al. |
| 5,441,900 | A | 8/1995 | Bulucea et al. |
| 5,446,330 | A | 8/1995 | Bulucea et al. |
| 5,475,348 | A | 12/1995 | Hode et al. |
| 5,719,538 | A | 2/1998 | Kadota |
| 6,344,705 | B1 | 2/2002 | Solal et al. |
| 6,445,265 | B1 | 9/2002 | Wright |
| 7,105,980 | B2 | 9/2006 | Abbott et al. |

(Continued)

FOREIGN PATENT DOCUMENTS

| | | |
|---|---|---|
| EP | 2658123 A1 | 12/2011 |
| EP | 2490333 A1 | 8/2012 |

(Continued)

OTHER PUBLICATIONS

Decision to Grant for Japanese Patent Application No. 2018-539285, dated Mar. 2, 2022, 5 pages.

(Continued)

*Primary Examiner* — Derek J Rosenau

(74) *Attorney, Agent, or Firm* — Withrow & Terranova, P.L.L.C.

(57) ABSTRACT

Guided Surface Acoustic Wave (SAW) devices with improved quartz orientations are disclosed. A guided SAW device includes a quartz carrier substrate, a piezoelectric layer on a surface of the quartz carrier substrate, and at least one interdigitated transducer on a surface of the piezoelectric layer opposite the quartz carrier substrate. The quartz carrier substrate includes an orientation that provides improved performance parameters for the SAW device, including electromechanical coupling factor, resonator quality factor, temperature coefficient of frequency, and delta temperature coefficient of frequency.

26 Claims, 21 Drawing Sheets

(56) References Cited

U.S. PATENT DOCUMENTS

| | | |
|---|---|---|
| 7,411,333 B2 | 8/2008 | Kihara et al. |
| 8,035,464 B1 | 10/2011 | Abbott et al. |
| 8,115,365 B2 | 2/2012 | Suzuki et al. |
| 8,456,257 B1 | 6/2013 | Fattinger |
| 8,710,509 B2 | 4/2014 | Nagano |
| 9,319,023 B2 | 4/2016 | Tanaka |
| 9,438,201 B2 | 9/2016 | Hori et al. |
| 9,503,049 B2 | 11/2016 | Nishii et al. |
| 10,084,427 B2 | 9/2018 | Solal et al. |
| 10,381,998 B2 | 8/2019 | Inoue et al. |
| 2007/0296306 A1 | 12/2007 | Hauser et al. |
| 2008/0252394 A1 | 10/2008 | Tajima et al. |
| 2009/0096046 A1 | 4/2009 | Heringa et al. |
| 2009/0236935 A1 | 9/2009 | Kando |
| 2010/0141086 A1 | 6/2010 | Suzuki et al. |
| 2010/0289379 A1 | 11/2010 | Owaki et al. |
| 2012/0032759 A1 | 2/2012 | Nishii et al. |
| 2012/0038435 A1 | 2/2012 | Yata et al. |
| 2013/0049533 A1 | 2/2013 | Matsuda et al. |
| 2013/0207747 A1 | 8/2013 | Nishii et al. |
| 2013/0285768 A1 | 10/2013 | Watanabe et al. |
| 2014/0145557 A1 | 5/2014 | Tanaka |
| 2014/0152146 A1 | 6/2014 | Kimura et al. |
| 2014/0167565 A1 | 6/2014 | Iwamoto |
| 2014/0210317 A1 | 7/2014 | Tai et al. |
| 2015/0069882 A1 | 3/2015 | Umeda et al. |
| 2015/0102705 A1 | 4/2015 | Iwamoto et al. |
| 2016/0380611 A1 | 12/2016 | Kai |
| 2017/0033756 A1 | 2/2017 | Inoue et al. |
| 2017/0033764 A1 | 2/2017 | Inoue et al. |
| 2017/0222618 A1 | 8/2017 | Inoue et al. |
| 2017/0222622 A1 | 8/2017 | Solal et al. |
| 2018/0102760 A1 | 4/2018 | Inoue et al. |
| 2018/0109241 A1 | 4/2018 | Inoue et al. |
| 2018/0109242 A1 | 4/2018 | Solal et al. |
| 2018/0159495 A1 | 6/2018 | Inoue et al. |
| 2018/0337654 A1 | 11/2018 | Solal et al. |
| 2019/0123709 A1 | 4/2019 | Inoue et al. |

FOREIGN PATENT DOCUMENTS

| | | |
|---|---|---|
| FR | 2788176 A1 | 7/2000 |
| JP | H06326553 A | 11/1994 |
| JP | 2002076835 A | 3/2002 |
| JP | 2004526977 A | 9/2004 |
| JP | 2006319679 A | 11/2006 |
| JP | 2007028538 A | 2/2007 |
| JP | 2015073331 A | 4/2015 |
| JP | 5713025 B2 | 5/2015 |
| JP | 2015109574 A | 6/2015 |
| JP | 2016184900 A | 5/2018 |
| WO | 02095941 A1 | 11/2002 |
| WO | 2008078481 A1 | 7/2008 |
| WO | 2010004741 A1 | 1/2010 |
| WO | 2010125934 A1 | 11/2010 |
| WO | 2011037145 A1 | 3/2011 |
| WO | 2011046117 A1 | 4/2011 |
| WO | 2012086639 A1 | 6/2012 |
| WO | 2013172251 A1 | 11/2013 |
| WO | 2017132183 A1 | 8/2017 |
| WO | 2017132184 A1 | 8/2017 |

OTHER PUBLICATIONS

Intention to Grant for European Patent Application No. 18196819.9, dated Apr. 12, 2022, 7 pages.

Notice of Allowance for U.S. Appl. No. 16/507,678, dated Apr. 6, 2022, 8 pages.

Notice of Reason for Rejection for Japanese Patent Application No. 2021073990, dated Jun. 28, 2022, 19 pages.

Author Unknown, "What is SAW Filters: Advantage of Token Piezoelectric SAW Devices," Token, Version 2010, 5 pages.

Author Unknown, "Working principles and Applications of SAW/FBAR Devices," TaiyoYuden, Navigator, Section 2, Aug. 11, 2014, pp. 10-15.

Chen, Jing et al., "Suppression Rayleigh Wave Spurious Signal in SH-SAW Devices Employing PMN-33%PT crystals," Proceedings of Symposium on Ultrasonic Electronics, vol. 31, Issue 2010, Dec. 6-8, 2010, pp. 287-288.

Emam, Mostafa, "RF SOI: from Material to ICs—an Innovative Characterization Approach," FD-SOI and RF-SOI Forum, Feb. 27, 2015, 35 pages.

Gong, Songbin et al., "Overmoded Shear Horizontal Wave MEMS Resonators using X-Cut Lithium Niobate Thin Film," 2014 IEEE International Ultrasonics Symposium (IUS), Sep. 3-6, 2014, pp. 568-571.

Kadota, Michio, et al., "Improved Quality Factor of Hetero Acoustic Layer (HAL) SAW Resonator Combining LiTaO3 Thin Plate and Quartz Substrate," International Ultrasonics Symposium, Washington, DC, Sep. 6-9, 2017, IEEE, 4 pages.

Hayashi, Junki, et al., "High Coupling and Highly Stable Leaky Saws on LiTaO3 Thin Plate Bonded to Quartz Substrate," Proceedings of Symposium on Ultrasonic Electronics, vol. 38, Oct. 2017, IEEE, 2 pages.

Malocha, Donald C., "Surface Acoustic Wave Technology and Wireless Applications," Presentation at the University of South Florida, Nov. 14, 2001, 145 pages.

Miura, M. et al., "Temperature Compensated LiTa03/Sapphire Bonded SAW Substrate with low Loss and High Coupling Factor Suitable for US-PCS Application," 2004 IEEE Ultrasonics Symposium, vol. 2, Aug. 23-27, 2004, pp. 1322-1325.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Reinhardt, Alexandre et al., "Acoustic filters based on thin single crystal $LiNbO_3$ films: Status and prospects," 2014 IEEE International Ultrasonics Symposium (IUS), Sep. 3-6, 2014, pp. 773-781.

Solal, M. et al., "Oriented lithium niobate layers transferred on 41 (100) silicon waferfor RF SAW devices," Proceedings of the 2002 IEEE Ultrasonics Symposium, vol. 1, Oct. 2002, IEEE, pp. 131-134.

Takai, Tsutomu, et al., "Incredible High Performance SAW resonator on Novel Multi-layerd Substrate," International Ultrasonics Symposium Proceedings, Sep. 18-21, 2016, Tours, France, IEEE, 4 pages.

Takai, Tsutomu, et al., "I.H.P.SAW Technology and its Application to Microacoustic Components (Invited)," International Ultrasonics Symposium, Sep. 6-9, 2017, Washington DC, IEEE, 8 pages.

Non-Final Office Action for U.S. Appl. No. 15/086,895, dated Dec. 15, 2017, 6 pages.

Notice of Allowance for U.S. Appl. No. 15/086,936, dated Jul. 9, 2018, 8 pages.

Non-Final Office Action for U.S. Appl. No. 15/087,225, dated Jun. 21, 2018, 5 pages.

Non-Final Office Action for U.S. Appl. No. 15/087,423, dated Jul. 31, 2018, 17 pages.

International Search Report and Written Opinion for International Patent Application No. PCT/US2017/014806, dated Apr. 21, 2017, 12 pages.

International Preliminary Report on Patentability for PCT/US2017/014806, dated Aug. 9, 2018, 9 pages.

International Preliminary Report on Patentability for PCT/US2017/014808, dated Aug. 9, 2018, 6 pages.

International Search Report and Written Opinion for International Patent Application No. PCT/US2017/014808, dated Apr. 19, 2017, 9 pages.

Gomi, Masashi, et al., "High-Coupling Leaky SAWs on LiNbO3 or LiTa03 Thin Plate Bonded to High-Velocity Substrate," Proceedings of Symposium on Ultrasonic Electronics, vol. 37, Nov. 16-18, 2016, 2 pages.

Gomi, Mashashi, et al., "High-coupling leaky surface acoustic waves on LiNBO3 or LiTaO3 thin plate bonded to high-velocity substrate," Japanese Journal of Applied Physics, vol. 56, Jun. 27, 2017, Japan Society of Applied Physics, 7 pages.

(56) References Cited

OTHER PUBLICATIONS

Hayashi, Junki, et al., "High-Coupling Leaky SAWs on LiTaO3 Thin Plate Bonded to Quartz Substrate," International Ultrasonics Symposium, Sep. 6-9, 2017, Washington, DC, IEEE, 4 pages.
Kadota, Micho, et al., "HAL SAW Resonators Using 42oYX-LiTaO3 Thin Plate on Quartz Substrate," International Frequency Control Symposium, Jul. 9-13, 2017, Besancon, France, IEEE, 2 pages.
Non-Final Office Action for U.S. Appl. No. 15/087,225, dated Feb. 8, 2019, 9 pages.
Ex Parte Quayle Action for U.S. Appl. No. 15/087,225, mailed Aug. 23, 2019, 5 pages.
Final Office Action for U.S. Appl. No. 15/087,423, dated Jan. 18, 2019, 14 pages.
Non-Final Office Action for U.S. Appl. No. 16/048,520, dated Mar. 5, 2019, 5 pages.
Notice of Allowance for U.S. Appl. No. 16/048,520, dated Jun. 7, 2019, 7 pages.
Extended European Search Report for European Patent Application No. 18196819.9, dated Mar. 1, 2019, 12 pages.
Notice of Allowance for U.S. Appl. No. 15/087,225, dated Oct. 9, 2019, 8 pages.
Corrected Notice of Allowability for U.S. Appl. No. 15/087,225, dated Jan. 28, 2020, 4 pages.
Notice of Allowance for U.S. Appl. No. 16/130,433, dated Jul. 30, 2020, 9 pages.
Corrected Notice of Allowability for U.S. Appl. No. 16/130,433, dated Nov. 24, 2020, 5 pages.
Non-Final Office Action for U.S. Appl. No. 16/507,678, dated Aug. 12, 2021, 19 pages.
Non-Final Office Action for U.S. Appl. No. 16/037,259, dated Dec. 4, 2020, 14 pages.
Final Office Action for U.S. Appl. No. 16/037,259, dated May 12, 2021, 14 pages.
Notice of Allowance for U.S. Appl. No. 16/037,259, dated Aug. 18, 2021, 7 pages.
Notice of Reason for Rejection for Japanese Patent Application No. 2018-539290, dated Sep. 2, 2020, 21 pages.
Notice of Reason for Rejection for Japanese Patent Application No. 2018-539290, dated Jan. 4, 2021, 6 pages.
Decision to Grant for Japanese Patent Application No. 2018-539290, dated Mar. 29, 2021, 5 pages.
Notice of Reason for Rejection for Japanese Patent Application No. 2018-539285, dated Sep. 18, 2020, 23 pages.
Notice of Reason for Rejection for Japanese Patent Application No. 2018-539285, dated Feb. 1, 2021, 11 pages.
Notice of Reason for Rejection for Japanese Patent Application No. 2018-539285, dated Aug. 4, 2021, 7 pages.
Examination Report for European Patent Application No. 18196819.9, dated Jul. 1, 2020, 4 pages.
Notice of Reason for Rejection for Japanese Patent Application No. 2021073990, dated Jan. 11, 2023, 6 pages.
Notice of Reason for Rejection for Japanese Patent Application No. 2018194054, dated Oct. 25, 2022, 12 pages.
Decision to Grant for Japanese Patent Application No. 2018194054, dated Apr. 7, 2023, 5 pages.

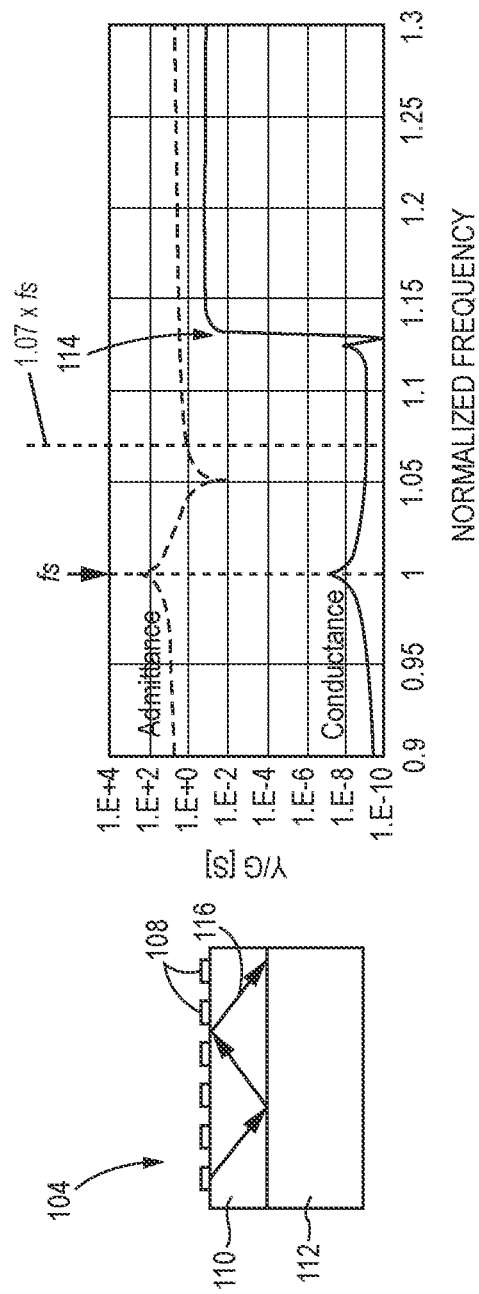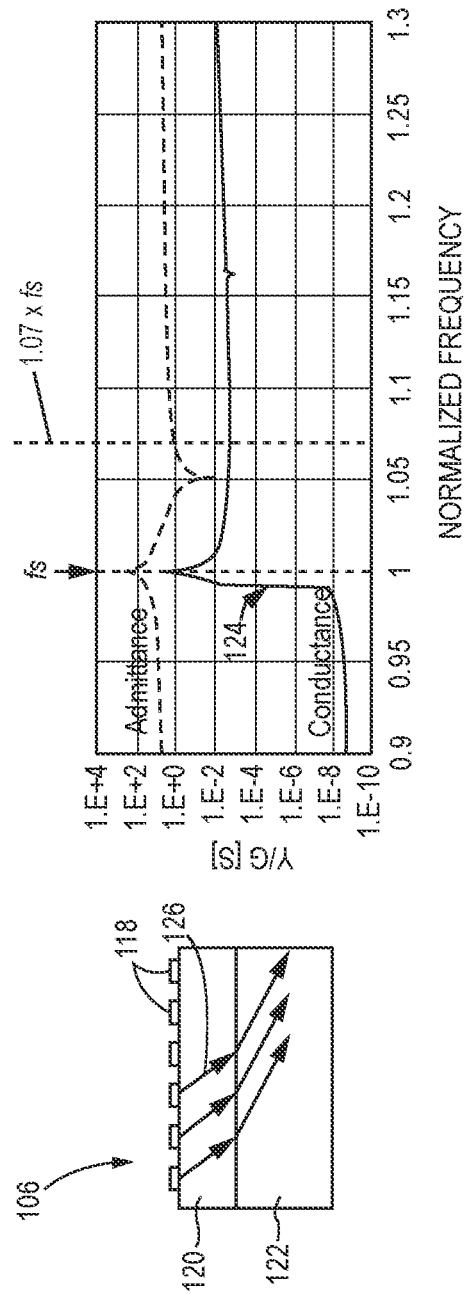
FIG. 17A
FIG. 17B

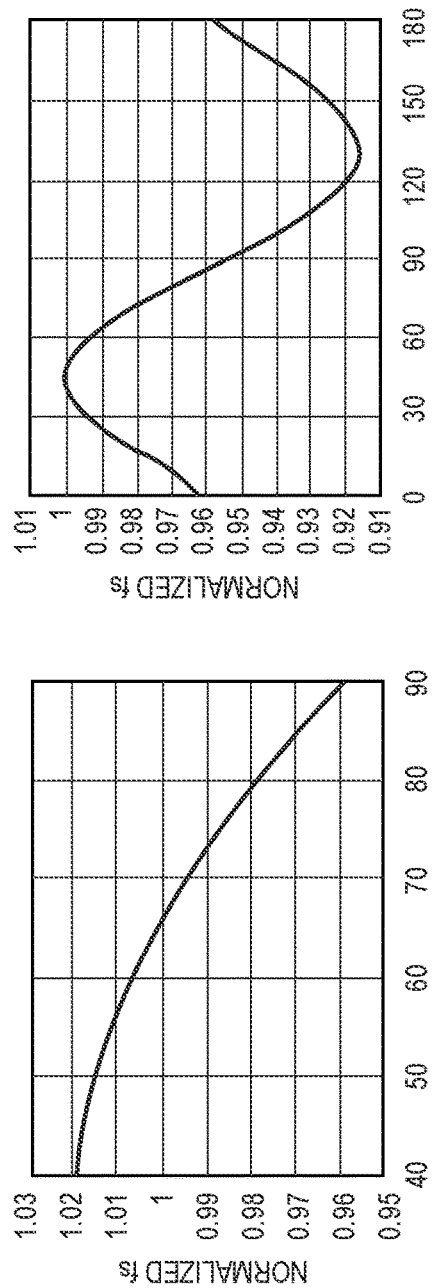
FIG. 19A
FIG. 19B
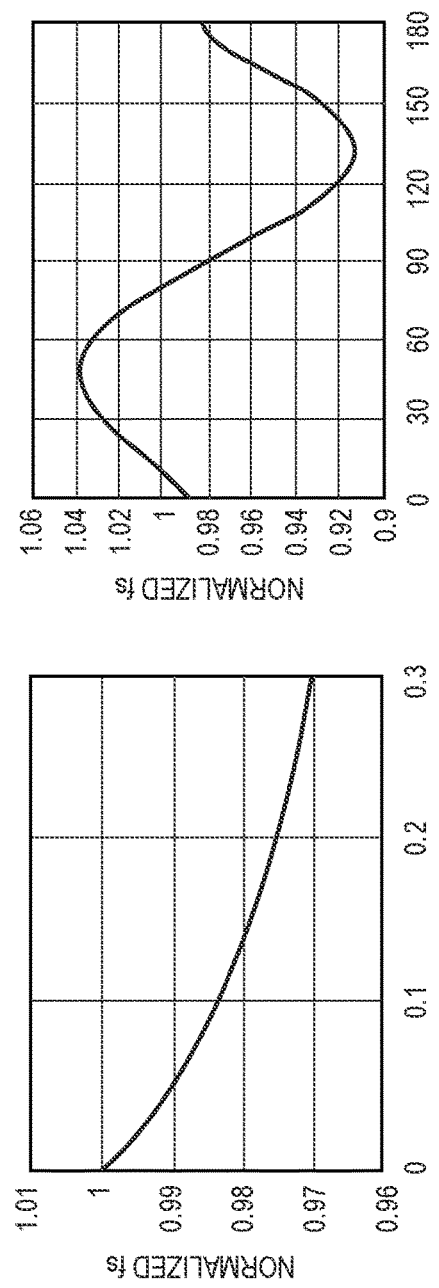
FIG. 19C
FIG. 19D

QUARTZ ORIENTATION FOR GUIDED SAW DEVICES

RELATED APPLICATIONS

This application is a continuation of U.S. patent application Ser. No. 16/037,259, filed Jul. 17, 2018, which claims the benefit of provisional patent application Ser. No. 62/575, 819, filed Oct. 23, 2017, the disclosures of which are hereby incorporated herein by reference in their entirety.

FIELD OF THE DISCLOSURE

The present disclosure relates to a Surface Acoustic Wave (SAW) device, and particularly to SAW devices with quartz carrier substrates.

BACKGROUND

Surface Acoustic Wave (SAW) devices, such as SAW resonators and SAW filters, are used in many applications such as Radio Frequency (RF) filters. For example, SAW filters are commonly used in Second Generation (2G), Third Generation (3G), and Fourth Generation (4G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As with any electronic device, the performance of a SAW device is an important parameter that can impact the overall performance of a system. In this regard, there is a need for a high performance SAW device.

SUMMARY

Aspects disclosed herein include quartz orientations for guided Surface Acoustic Wave (SAW) devices. A guided SAW device includes a quartz carrier substrate, a piezoelectric layer on a surface of the quartz carrier substrate, and at least one Interdigitated Transducer (IDT) on a surface of the piezoelectric layer opposite the quartz carrier substrate. The quartz carrier substrate includes an orientation that provides improved performance parameters for the SAW device, including electromechanical coupling factor, resonator quality factor, temperature coefficient of frequency, and delta temperature coefficient of frequency.

In one aspect, the quartz carrier substrate comprises a plane obtained by rotating a Y-cut quartz substrate in a range of 55° to 80° along the X axis, and a propagation direction is obtained by rotating the X axis in a range of 75° to 105° in the plane. In some embodiments, the plane is obtained by rotating the Y-cut quartz substrate in a range of 60° to 80°, or in a range of 65° to 80°. In some embodiments, the plane is obtained by rotating the Y-cut quartz substrate by 66.31° along the X axis. In other embodiments, the plane is obtained by rotating the Y-cut quartz substrate by 69° along the X axis. In some embodiments, the piezoelectric layer comprises Lithium Tantalate with an orientation between Y and Y+60°. In other embodiments, the piezoelectric layer comprises Lithium Niobate with an orientation between Y−20° and Y+60°. In some embodiments, the SAW device comprises additional layers, such as a dielectric layer between the quartz carrier substrate and the piezoelectric layer.

In some embodiments, parameter ranges for geometry and orientation of various layers of the SAW device are configured to provide a cut-off frequency that is at least 1.07 times greater than a resonance frequency. The parameter ranges may include a rotation angle of the quartz carrier substrate, a rotation angle and thickness of the piezoelectric layer, a duty factor and a thickness of the IDT, and a thickness of the dielectric layer.

In another aspect, a SAW device includes a quartz carrier substrate, a piezoelectric layer on a surface of the quartz carrier substrate, and at least one IDT on a surface of the piezoelectric layer opposite the quartz carrier substrate, wherein a cut plane for the quartz carrier substrate comprises a crystalline orientation having Euler angles ($\alpha$, $\beta$, $\gamma$) of at least one of the following: $\alpha$ is in a range of −55° to −65°, $\beta$ is in a range of 18° to 28°, and $\gamma$ is in a range of 85° to 95°; or $\alpha$ is in a range of −5° to 5°, $\beta$ is in a range of −18° to −28°, and $\gamma$ is in a range of −85° to −95°; or $\alpha$ is in a range of 55° to 65°, $\beta$ is in a range of 18° to 28°, and $\gamma$ is in a range of 85° to 95°. In some embodiments, the crystalline orientation is rotated along the propagation direction in a range of 0° to 30°, or in a range of 150° to 210°, or in a range of 330° to 360°.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 17A illustrates the relative position of a bulk cut-off frequency for a SAW device where acoustic energy is guided inside a piezoelectric layer.

FIG. 17B illustrates the relative position of a bulk cut-off frequency for a SAW device where acoustic energy radiates into the bulk of a quartz carrier substrate.

FIG. 19A is a plot representing simulation results for normalized fs as a function of a rotation angle $\theta 1$ of the quartz carrier substrate of FIG. 18.

FIG. 19B is a plot representing simulation results for normalized fs as a function of a rotation angle $\theta 2$ of the piezoelectric layer of FIG. 18.

FIG. 19C is a plot representing simulation results for normalized fs as a function of the thickness h3 of the dielectric layer of FIG. 18.

FIG. 19D is a plot representing simulation results for normalized fs as a function of the rotation angle $\theta 2$ of the piezoelectric layer of FIG. 18 for a SAW device that does not include a quartz substrate, i.e. a LT-only SAW device.

DETAILED DESCRIPTION

Figure 1:
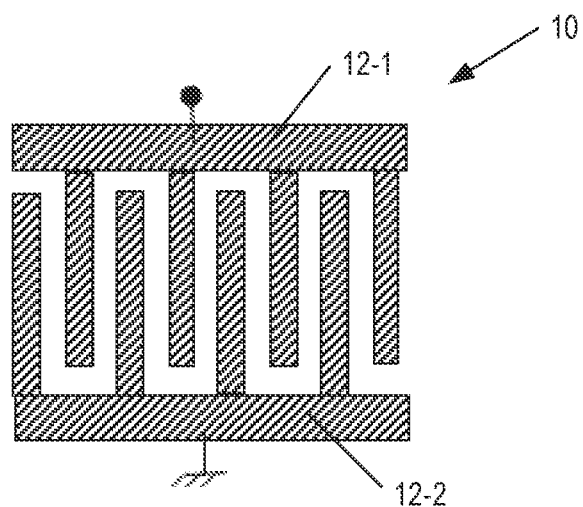
FIG. 1 is a diagram showing the principle of a Surface Acoustic Wave (SAW) Interdigitated Transducer (IDT).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include quartz orientations for guided Surface Acoustic Wave (SAW) devices. A guided SAW device includes a quartz carrier substrate, a piezoelectric layer on a surface of the quartz carrier substrate, and at least one Interdigitated Transducer (IDT) on a surface of the piezoelectric layer opposite the quartz carrier substrate. The quartz carrier substrate includes an orientation that provides improved performance parameters for the SAW device, including electromechanical coupling factor, resonator quality factor, Temperature Coefficient of Frequency (TCF), and the difference between TCFs at a resonance and antiresonance frequency (delta TCF).

A major factor of loss for Radio Frequency (RF) SAW devices using shear horizontal waves is acoustic radiation in a bulk substrate of the SAW device. A way to suppress this radiation is to use a piezoelectric film, or layer, laminated on a carrier substrate. The present disclosure relates to the use of quartz as the carrier substrate. Quartz presents the advantages of small viscous losses, small permittivity, and small thermal sensitivity. Also, compared with Silicon (Si), resistive losses in the substrate do not exist for quartz. In some embodiments, optimal orientations for a quartz substrate are disclosed.

Before describing embodiments of the present disclosure in further detail, a discussion of SAW devices and some associated problems is beneficial. SAW filters use the propagation of acoustic waves at the surface of a piezoelectric substrate. FIG. 1 shows one example of a SAW IDT 10. As illustrated, the IDT 10 includes two electrodes 12-1 and 12-2 that are deposited on (e.g., directly on) a surface of a piezoelectric substrate (not shown). A voltage is applied between the two electrodes 12-1 and 12-2. This results in electrical fields between the two electrodes 12-1 and 12-2 and generation of SAWs by the piezoelectric effect. Due to the sequence of electrodes at alternate potentials, the fields for two consecutive electrodes are of opposite directions. This means that the IDT 10 has its maximum efficiency when the electrode pitch is half the acoustic wavelength.

Figure 2:
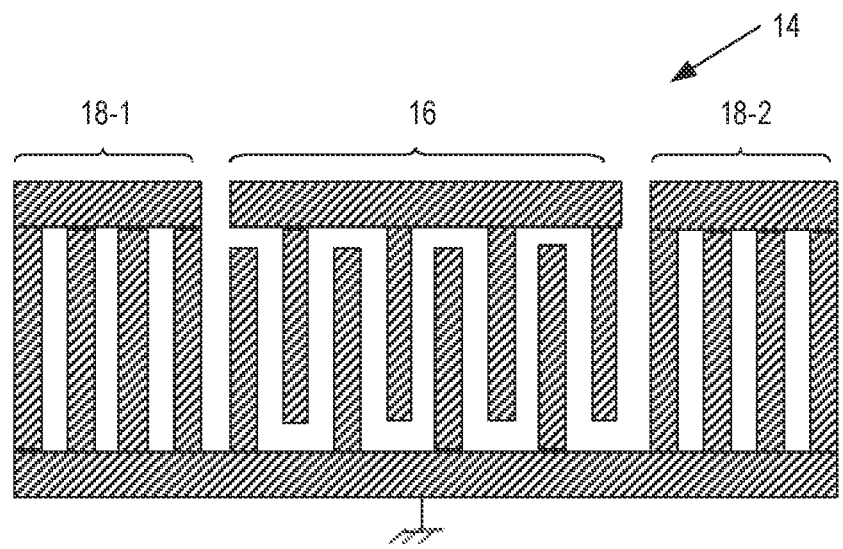
FIG. 2 is a diagram of a SAW resonator.

FIG. 2 shows one example of a SAW resonator 14. The SAW resonator 14 includes an IDT 16 inserted between two gratings 18-1 and 18-2, which are connected to ground in FIG. 2. The two gratings 18-1 and 18-2 act as reflectors and define an (acoustic) cavity. In alternative configurations, the gratings 18-1 and 18-2 may be connected to signal or the gratings 18-1 and 18-2 may be floating.

Figure 3:
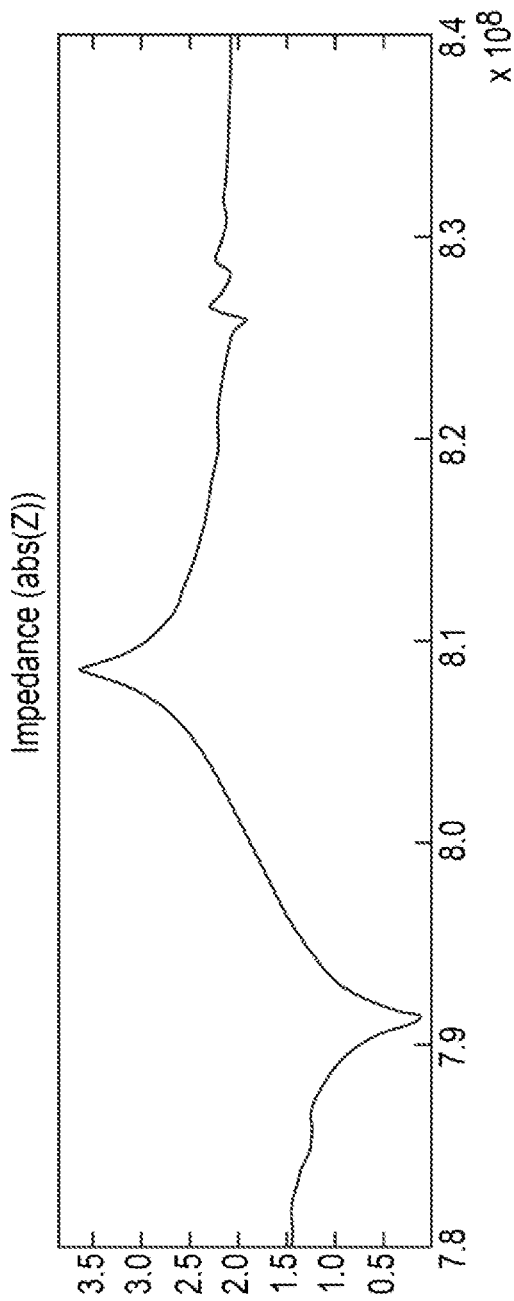
FIG. 3 is a plot showing an example of impedance (Z) for a SAW resonator.

FIG. 3 shows an example of resonator impedance (i.e., the impedance of one example of a SAW resonator such as, e.g., the SAW resonator 14 of FIG. 2). FIG. 3 is in log scale, i.e., it is not the abs(Z) which is plotted, but its log with some scaling factor. FIG. 3 is only for illustration. At a resonance frequency, the impedance of the SAW resonator is close to zero and the SAW resonator acts as a short circuit. At an antiresonance frequency, the impedance of the SAW resonator is very large, and the SAW resonator acts as an open circuit. Using these properties, it is possible to design a ladder filter.

Figure 4:
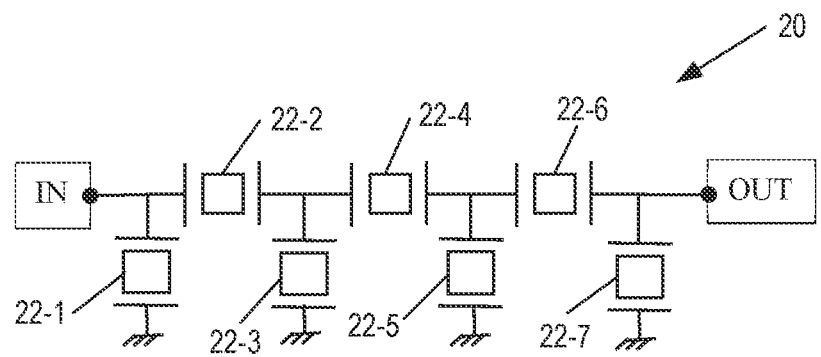
FIG. 4 is a schematic showing the principle of a ladder filter.

One example of a ladder filter 20 is illustrated in FIG. 4. As shown, several SAW resonators 22-1 through 22-7 are connected inside an electrical circuit. In general, the ladder filter 20 is designed such that shunt resonators (i.e., the SAW resonators 22-1, 22-3, 22-5, and 22-7) have an antiresonance frequency close to the center frequency of the ladder filter 20. Also, series resonators (i.e., the SAW resonators 22-2, 22-4, and 22-6 in the example of FIG. 4) are designed to have their resonance frequency close to the center frequency of the ladder filter 20. Thus, at the center frequency, the shunt resonators act as open circuits, the series resonators act as short circuits, and there is a direct connection between an input and an output of the ladder filter 20. At their resonance frequency, the shunt resonators act as short circuits, producing a notch in the transfer function of the ladder filter 20 below the passband. Similarly, at their antiresonance frequency, the series resonators act as open circuits and produce a notch above the stop band. Obviously, this is only a schematic explanation, and physical filters often have several different resonance frequencies for the shunt resonators and antiresonance frequencies for the series resonators. Also, the design may include several lumped elements such as capacitances or inductances that shift effective resonance frequencies of the resonators. Also, the filter shown in FIG. 4 is starting (at the input) and finishing (at the output) by the shunt resonators. Obviously, this is only for illustration and series resonators can also be connected to the input and/or output. Many alternative configurations for the ladder filter, not shown on the figure, are possible. For example and not limited to, in some cases, the ladder filter may have several consecutive series resonators or shunt resonators.

Figure 5:
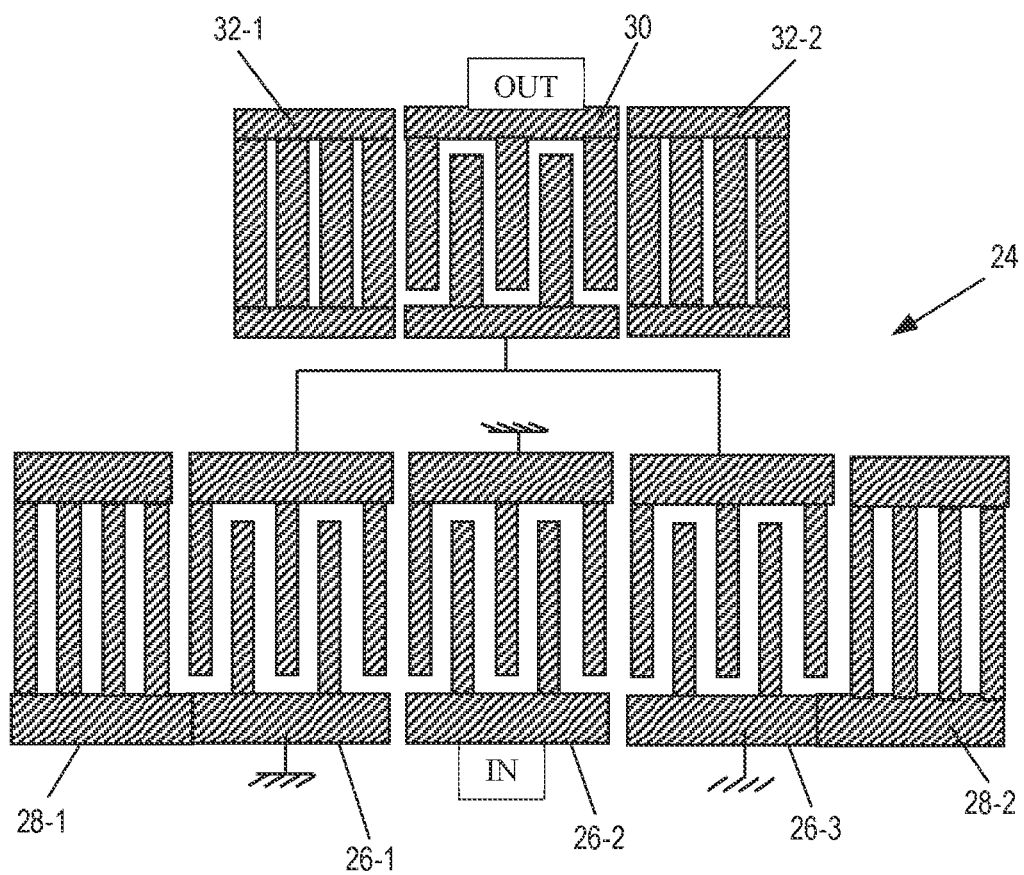
FIG. 5 is a diagram showing an example of a coupled resonator filter cascaded with a resonator.

In addition to ladder filters, it is possible to design so-called Coupled Resonator Filters (CRFs) or Double Mode SAW (DMS) filters. Instead of using SAW resonators as circuit elements, CRFs are designed by placing several transducers between two reflective gratings. In an example CRF 24 shown in FIG. 5, three IDTs 26-1 through 26-3 are placed between two reflectors 28-1 and 28-2. The center IDT 26-2 is connected to an input signal, whereas the two external IDTs 26-1 and 26-3 are connected in parallel. A cavity between the two reflectors 28-1 and 28-2 has several longitudinal modes. By choosing a symmetric arrangement of the IDTs 26-1 through 26-3, only the symmetric longitudinal modes are excited. This type of CRF normally uses mainly two longitudinal modes to couple the input IDT 26-2 to the output IDTs 26-1 and 26-3. The passband width is proportional to the frequency difference of these two modes. The coupling factor defines the possibility to electrically match the filter. As for ladder filters, a larger coupling factor allows a wider relative bandwidth. In the example of FIG. 5, the output IDTs 26-1 and 26-3 of the CRF stage are connected to a series resonator formed by, in this example, an IDT 30 and reflectors 32-1 and 32-2.

More generally, one or several CRF stages can be cascaded to one of several ladder elements. The ladder elements can be series or shunt resonators. Also, the number of transducers between the gratings can vary from two to a number as large as nine, for example. As it is well known, the space shifts between the transducers, and their lengths, polarities, and periods have a large influence on the device performance Several parameters are important for a SAW resonator. One important parameter is the effective piezoelectric coupling factor, which depends on the ratio between antiresonance and resonance frequency. SAW resonators with larger coupling factors have larger frequency shifts between resonance and antiresonance and can be used to design wideband filters. The coupling factor mostly depends on the chosen piezoelectric substrate. Another important parameter of a SAW resonator is the resonator quality factor (Q), which influences the insertion losses of a filter designed with the SAW resonator and the steepness of the filter response. The quality factor (Q) depends mostly on the acoustic and electric losses in the SAW resonator.

Also, the resonance frequency of a SAW resonator is proportional to the velocity of the SAW. When the temperature changes, the velocity of the wave changes, and the filter shifts in frequency. Additionally, due to thermal expansion, the component dimensions change, leading also to an additional frequency shift. SAW filters need to be able to select a frequency band for a temperature range that is typically a range of 100° Celsius (C) or more. A large temperature sensitivity of the center frequency of a SAW filter results in a filter response shifting in frequency and overall in a degraded performances inside a given temperature range. The temperature sensitivity is measured by a coefficient, the TCF. Most materials have a negative TCF, meaning that the frequency decreases when the temperature increases.

The substrate choice for a SAW filter is critical for the performance of the device. It is common to use a substrate made of Lithium Tantalate ($LiTaO_3$), which is sometimes abbreviated as LT herein, with an orientation typically between Y+0° and Y+60° and a propagation along the X-axis of the LT crystal (i.e., the crystallographic X-axis of the LT). Generally, an orientation designated as Y+θ, propagation X means that normal to the plane is the axis Y rotated by θ, where the rotation is done around the X-axis. On these substrates, the device is exciting primarily so-called leaky SAWs or pseudo SAWs or shear horizontal waves. The mechanical displacement associated with these waves is primarily in the direction parallel to the electrodes. The advantage of this type of wave is to produce a large electroacoustic coupling while keeping a relatively good temperature stability of the device frequency. Similarly, it is also possible to design a filter for a substrate of Lithium Niobate ($LiNbO_3$) with an orientation between Y−20° and Y+60° with a propagation along the X-axis. In this case, the same type of acoustic wave is excited. A large coupling coefficient can be obtained.

When designing SAW devices that excite leaky SAWs, a well-known problem is the existence of propagation losses that, for SAW resonators, translate into a bad quality factor and, for SAW filters, translate into the impossibility of realizing steep frequency transition and low insertion losses. These propagation losses are due to the presence of a bulk mode at a velocity close to the velocity of the leaky SAWs. This results in acoustic energy radiation or scattering in the bulk.

Figure 6:
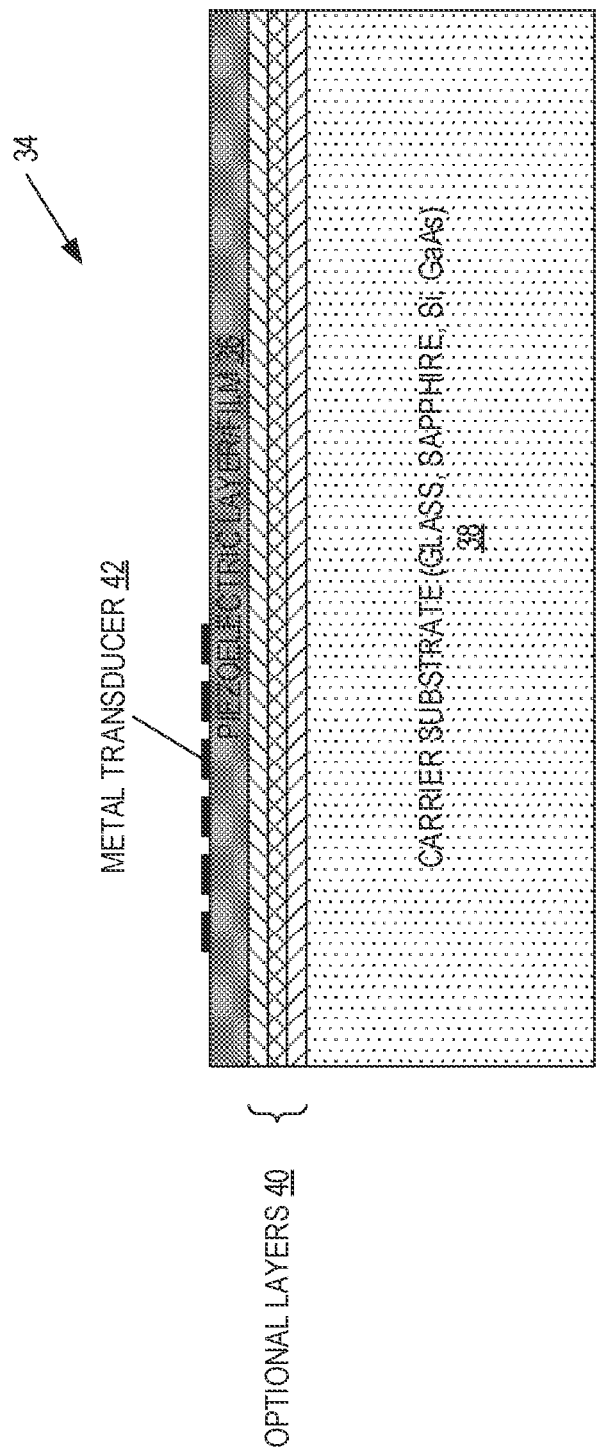
FIG. 6 is a diagram showing a SAW device using a carrier substrate, a piezoelectric film, and optionally layers.

A way to suppress this bulk radiation is to use a layered substrate where a layer of piezoelectric material, which is referred to herein as a piezoelectric layer, or film, is bonded or deposited on (e.g., directly on) the surface of a carrier substrate. One example of a SAW device 34 including a piezoelectric layer, or film, 36 bonded or deposited on a carrier substrate 38 is illustrated in FIG. 6. As illustrated, the SAW device 34 includes the carrier substrate 38, one or more optional layers 40 on (e.g., directly on) the surface of the carrier substrate 38, the piezoelectric layer 36 on the surface of the one or more optional layers 40 opposite the carrier substrate 38, and a metal transducer, or IDT, 42 on the surface of the piezoelectric layer 36 opposite the carrier substrate 38. Alternatively, there may be no optional layer(s) 40 such that the piezoelectric layer 36 is on (e.g., directly on) the surface of the carrier substrate 38. The optional layers 40 may include one or more dielectric layers, metallic layers, piezoelectric layers and combinations thereof.

If the Bulk Acoustic Wave (BAW) velocity of the carrier substrate 38 in the direction of propagation of the SAW is larger than the velocity of the (pseudo) SAW device 34, then it is possible to guide the acoustic energy inside the piezoelectric layer 36, and the loss into the bulk (i.e., the loss into the substrate) can be cancelled. Several intermediate layers (e.g., the one or more optional layers 40) can be placed between the piezoelectric layer 36 and the carrier substrate 38. These layers can be used to improve the acoustic guiding or the piezoelectric coupling, or they may be required for the manufacturing process of the device. For example, this type of approach has been proposed in U.S. Pat. No. 6,445,265, entitled "DEVICE WITH ACOUSTIC WAVES GUIDED IN A FINE PIEZOELECTRIC MATERIAL FILM BONDED WITH A MOLECULAR BONDING ON A BEARING SUBSTRATE AND METHOD FOR MAKING THE SAME," issued Sep. 3, 2002; French Patent No. 2788176, entitled "DISPOSITIF A ONDES ACOUSTIQUES GUIDEES DANS UNE FINE COUCHE DE MATERIAU PIEZO-ELECTRIQUE COLLEE PAR UNE COLLE MOLECULAIRE SUR UN SUBSTRAT PORTEUR ET PROCEDE DE FABRICATION," issued May 25, 2001; Solal, M. et al., "Oriented Lithium Niobate Layers Transferred on 4″ [100] Silicon Wafer for RF SAW Devices," Proceedings of the 2002 IEEE Ultrasonics Symposium, Vol. 1, Oct. 8-11, 2002, pages 131-134 (hereinafter "Sola)"); and Pastureaud, T. et al., "High-Frequency Surface Acoustic Waves Excited on Thin-Oriented $LiNbO_3$ Single-Crystal Layers Transferred onto Silicon," IEEE Transactions on Ultrasonics, Ferroelectrics, and Frequency Control, Vol. 54. No. 4, April 2007, pages 870-876 (hereinafter "Pastureaud"). These documents disclose a SAW device built on a thin layer of piezoelectric material on top of a carrier substrate. Other layers can be present between the piezoelectric layer and the carrier substrate. These intermediate layers usually are dielectric layers, but in some cases it was proposed to use metallic layers. Piezoelectric layers are also possible. The velocity in the carrier substrate is large enough to allow the acoustic wave to be guided.

The process used to manufacture the SAW device 34 uses, in some examples, wafer bonding of a wafer of piezoelectric material on the carrier substrate 38 or the carrier substrate 38 with deposited layers (e.g., the one or more optional layers 40). It is also relatively common to use Silicon Oxide ($SiO_2$) as one of the optional layers 40 and to bond the piezoelectric layer 36 onto the $SiO_2$ layer. The piezoelectric layer 36 can be formed by using, e.g., an ion slicing process as described in U.S. Pat. No. 6,445,265; French Patent No. 2788176; Solal; and Pastureaud. In this case, a piezoelectric substrate is implanted before being bonded to the carrier substrate 38. This implantation produces defects inside the piezoelectric substrate at a depth depending on the implantation energy. This allows the piezoelectric substrate to be broken and a thin layer of piezoelectric material to remain at the surface of the carrier substrate 38 as the piezoelectric layer 36. The drawback of this approach is that the thickness of the piezoelectric substrate is limited by the implantation energy, and it is difficult to obtain piezoelectric layers thicker than some tenths of micrometers. Also, the implantation may damage the piezoelectric film resulting in more losses or smaller coupling coefficient. This process is generally referred as "ion slicing." An alternate process consists of grinding the piezoelectric substrate in order to get a thin layer of piezoelectric material (i.e., the piezoelectric layer 36). In this case, the thickness accuracy is difficult to obtain, and it is usually a good practice to choose a frequency and layer thickness minimizing the sensitivity of the frequency to the fabrication process.

The choice of the carrier substrate 38 is critical to obtain good performance. U.S. Pat. No. 6,445,265 and French Patent No. 2788176 disclose a carrier substrate made of glass, sapphire, Si, or Gallium Arsenide, whereas a commonly used carrier substrate is one made of Si. One problem of Si is its conductivity, which results in losses by dielectric influence. This can be reduced by treating the Si by implantation or using relatively thick layers between the piezoelectric layer 36 and the carrier substrate 38. In addition to increasing the manufacturing cost of the SAW device 34, the use of deposited layers may result in some increase of the acoustic propagation loss due to the difficulty of getting good quality deposited materials. This problem is present when a $SiO_2$ layer is used between the carrier substrate 38 and the piezoelectric layer 36. The use of $SiO_2$ is favorable for its positive temperature coefficient of velocity, which can be used to reduce the TCF of the SAW device 34. Also, $SiO_2$ has the advantage of having a low dielectric permittivity, which reduces the capacitance of the SAW device 34 and increases its coupling factor.

Figure 7:
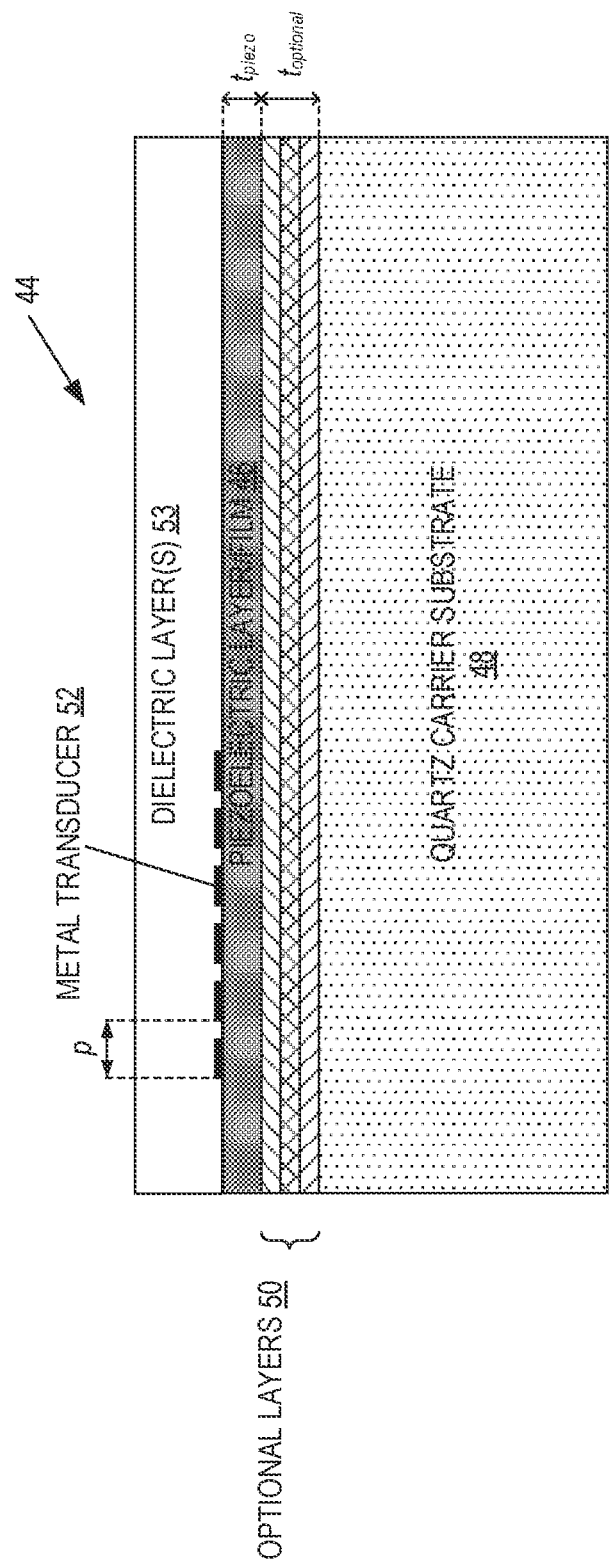
FIG. 7 is a diagram illustrating a SAW device having a quartz carrier substrate, a piezoelectric film/layer, and optionally one or more layers according to some embodiments of the present disclosure.

FIG. 7 illustrates a SAW device 44 according to some embodiments of the present disclosure. As illustrated, the SAW device 44 includes a piezoelectric layer, or film, 46 on a quartz carrier substrate 48, one or more optional layers 50 on (e.g., directly on) a surface of the quartz carrier substrate 48, the piezoelectric layer 46 on a surface of the one or more optional layers 50 opposite the quartz carrier substrate 48, a metal transducer, or IDT, 52 on a surface of the piezoelectric layer 46 opposite the quartz carrier substrate 48, and optionally one or more dielectric layers 53 (e.g., one or more layers of $SiO_2$, which may in some embodiments be doped) on a surface of the metal transducer 52 and an exposed surface of the piezoelectric layer 46. In some embodiments, the IDT 52 is embedded in the one or more dielectric layers 53. Note that while only one metal transducer 52 is illustrated, it should be appreciated that there may be any number of one or more metal transducers 52 and gratings/reflectors on the surface of the piezoelectric layer 46. The separation between individual fingers of the metal transducer 52 defines a pitch (p). A center-frequency wavelength ($\lambda$), or an IDT period, is defined where fingers of an IDT repeat themselves. For example, an IDT with single alternating fingers, which may also be referred to as a "single-electrode" transducer, the center-frequency wavelength ($\lambda$) or IDT period is approximately two times the pitch (p). For an IDT with multiple alternating fingers, such as alternating pairs of fingers or a "double-electrode" transducer, the center-frequency wavelength ($\lambda$) or IDT period is approximately four times the pitch (p). Again, while the one or more layers 50 and 53 are illustrated in FIG. 7, the one or more layers 50 and 53 are optional. Further, in some embodiments, the one or more layers 50 and 53 include at least one layer of $SiO_2$ that is, in some embodiments, doped with a dopant such as e.g., Fluoride or Boron in order to e.g., further improve the TCF.

The choice of the material used for the carrier substrate 48 is critical for the performance of the SAW device 44. The carrier substrate 48 needs to have the following properties:

The carrier substrate 48 has to be insulating. A metallic substrate produces a strong coupling between a filter input and output and adds a capacitance that reduces the electroacoustic coupling. A semiconductor substrate also produces some losses due to its conductivity.

The carrier substrate 48 needs to have a low permittivity to reduce the device capacitance and to increase the piezoelectric coupling.

The carrier substrate 48 needs to have low acoustic viscous losses, which can be obtained normally by using a monocrystalline substrate.

The TCF for the carrier substrate 48 should be small (in absolute value) and if possible have a sign opposite to that of the TCF of the piezoelectric layer 46, which is negative. Additionally, a low coefficient of thermal expansion is favorable.

One of the crystals widely used for acoustic devices is quartz. Quartz presents several advantages:

Quartz has a low dielectric constant of about 4.5.

Quartz is not a semiconductor, which means that its conductivity is very low.

Quartz has been extensively studied for SAW and BAW devices, and the quality of quartz has been enhanced to reduce viscous losses. For this reason, resonators with very good quality factors can be obtained using a piezoelectric layer on quartz.

From the point of view of thermal sensitivity, quartz has the advantage of a low temperature sensitivity and has compensated cuts for which the TCF is 0.

As such, quartz is utilized as the material for the carrier substrate 48 of the SAW device 44. Further details of such devices may be found in commonly assigned U. S. Patent Application Publication No. 2017/0222622, filed Mar. 31, 2016, the entirety of which is incorporated by reference herein.

As previously described, the one or more layers 50 are optional. If used, the one or more optional layers 50 may include one or dielectric materials such as, for example, $SiO_2$ having a collective thickness ($t_{optional}$). The optional layer(s) 50 are each normally thinner than the center-frequency wavelength ($\lambda$), or IDT period. The piezoelectric layer 46 is formed of any suitable piezoelectric material(s). In some preferred embodiments described herein, the piezoelectric layer 46 is formed of LT, or $LiNbO_3$, but is not limited thereto. In some embodiments, the piezoelectric layer 46 has a thickness ($t_{piezo}$) that is less than two times the IDT period. In other embodiments, the thickness ($t_{piezo}$) of the piezoelectric layer 46 is less than one times the IDT period. In other embodiments, the thickness ($t_{piezo}$) of the piezoelectric layer 46 is less than about seventy percent of the IDT period. Also, optionally one or several dielectric layers (i.e., the dielectric layer(s) 53), like for example $SiO_2$, Silicon Nitride, and Aluminum Oxide, can be deposited at the surface to realize a passivation. It can also be advantageous to embed the electrode inside a dielectric film of $SiO_2$ to further reduce the temperature sensitivity of the SAW device 44.

For example, in some embodiments, the piezoelectric layer 46 is LT, and the thickness ($t_{piezo}$) of the piezoelectric layer 46 is less than two times the IDT period. Further, in some embodiments, the LT used for the piezoelectric layer 46 has an orientation between Y and Y+60°. In some other embodiments, the piezoelectric layer 46 is $LiNbO_3$, and the thickness ($t_{piezo}$) of the piezoelectric layer 46 is less than two times the IDT period. Further, in some embodiments, the $LiNbO_3$ used for the piezoelectric layer 46 has an orientation between Y−20° and Y+60°.

As discussed above, if the bulk acoustic velocity of the quartz carrier substrate in the direction of propagation of the SAW is larger than the velocity of the (pseudo) SAW device, then it is possible to guide the acoustic energy inside the piezoelectric layer, and the loss into the bulk can be cancelled. In other words, it is desirable for the bulk acoustic velocity of the quartz carrier substrate in the direction of propagation of the SAW to be as high as possible compared to the velocity of the SAW device.

Figure 8:
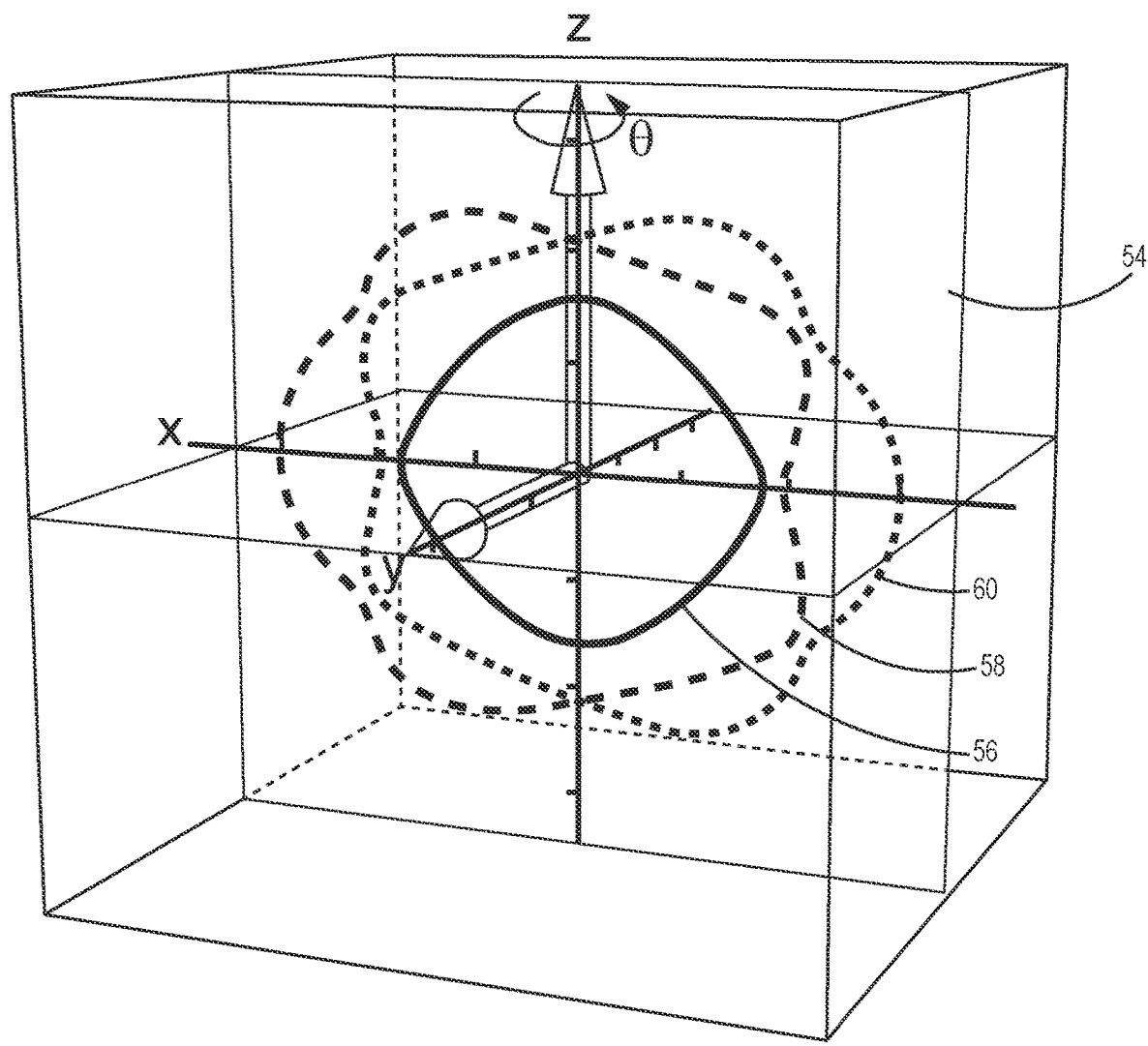
FIG. 8 represents slowness curves for bulk acoustic modes for Y-cut Z-propagation quartz.

FIG. 8 represents slowness curves for bulk acoustic modes for a propagation in the Y-cut plane quartz. The nominal propagation direction is in the Z direction. In FIG. 8, a cut plane 54 is taken along a Y-face of a quartz crystal. A rotation angle θ represents a rotation angle along the Z-axis. The slowness curves include plots for a longitudinal wave 56, a fast shear wave 58, and a slow shear wave 60. As illustrated, the crystal orientation with the fastest slow shear velocity is the Z orientation, or Z-propagation. In particular, the velocity along the Z orientation may comprise a value of at least 4670 meters per second (m/s). Globally, this means that a quartz carrier substrate with a propagation direction that makes an angle smaller than 10° with the crystal Z-axis, or a Z-propagation has the fastest slow shear velocity.

Figure 9A:
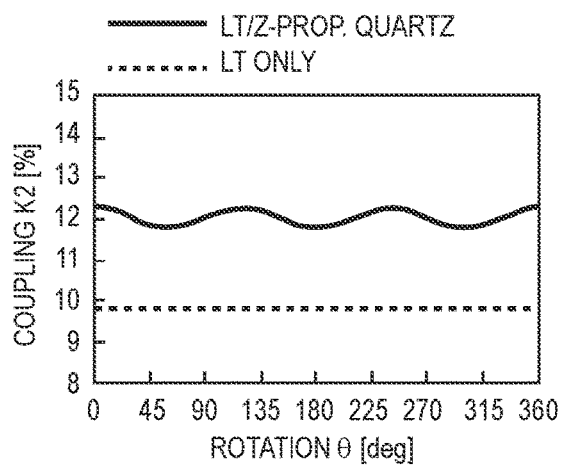
FIG. 9A is a plot comparing the electromechanical coupling factor (K2) of a LT/Z-propagation SAW device with a LT-only SAW device across a rotation angle $\theta$ along the Z-axis.
Figure 9B:
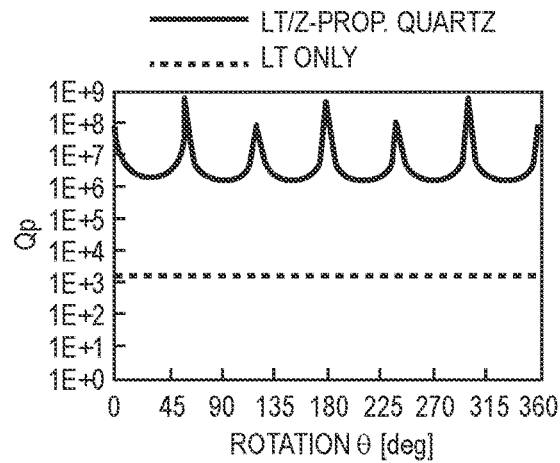
FIG. 9B is a plot comparing the resonator quality factor (Q) of the LT/Z-propagation SAW device with the LT-only SAW device.
Figure 9C:
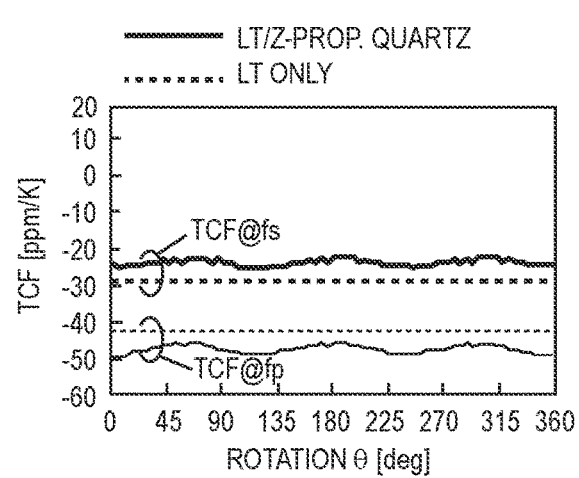
FIG. 9C is a plot comparing the Temperature Coefficient of Frequency (TCF) of the LT/Z-propagation SAW device with the LT-only SAW device for both a resonance frequency and an antiresonance frequency.
Figure 9D:
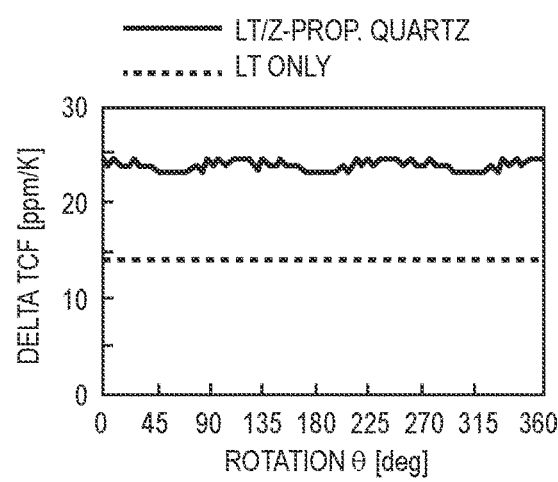
FIG. 9D is a plot comparing the delta TCF of the LT/Z-propagation SAW device with the LT-only SAW device.

FIGS. 9A-9D compare simulation results for various performance parameters of a SAW device that includes a Y+42° LT piezoelectric layer on a Z-propagation quartz substrate (LT/Z-propagation) with another SAW device that includes only a Y+42° LT piezoelectric substrate (LT-only). FIG. 9A is a plot comparing the electromechanical coupling factor (K2) of the LT/Z-propagation SAW device with the LT-only SAW device across the rotation angle θ along the Z-axis of the quartz substrate. The electromechanical coupling factor (K2) is related to how effective a piezoelectric material converts electrical energy into mechanical energy, or vice versa. Generally, a high K2 means increased conversion efficiency. As illustrated in FIG. 9A, the LT/Z-propagation SAW device has a notably higher K2 than the LT-only SAW device. FIG. 9B is a plot comparing the resonator quality factor (Q) of the LT/Z-propagation SAW device with the LT-only SAW device. A higher Q value indicates a lower rate of energy loss. As illustrated, the LT/Z-propagation SAW device has a notably higher Q than the LT-only SAW device. FIG. 9C is a plot comparing the TCF of the LT/Z-propagation SAW device with the LT-only SAW device for both the resonance frequency, fs, and the antiresonance frequency, fp. As illustrated, the TCF is only marginally improved for the LT/Z-propagation SAW device. FIG. 9D is a plot comparing the delta TCF of the LT/Z-propagation SAW device with the LT-only SAW device. The delta TCF is the difference in the TCF between the resonance frequency and the antiresonance frequency, and a delta TCF as small as possible is desired. As illustrated, the delta TCF is higher for the LT/Z-propagation SAW device. Accordingly, the LT/Z-propagation SAW device demonstrates notable improvements in the K2 and Q factors; however, the TCF is only marginally increased and the delta TCF is worse.

Figure 10:
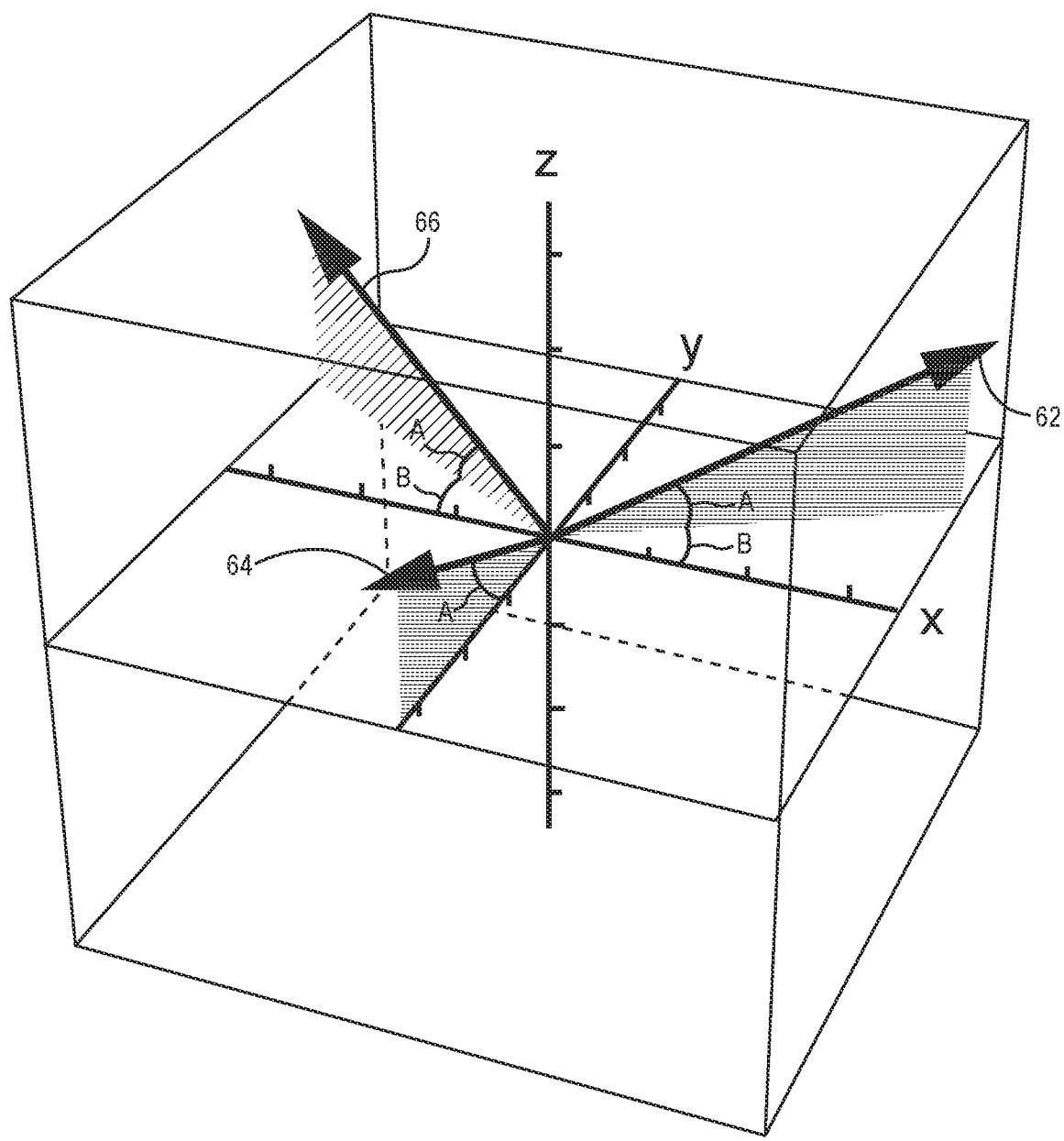
FIG. 10 illustrates propagation directions for a bulk quartz crystal that have the second fastest maximum of slow shear velocity.
Figure 11A:
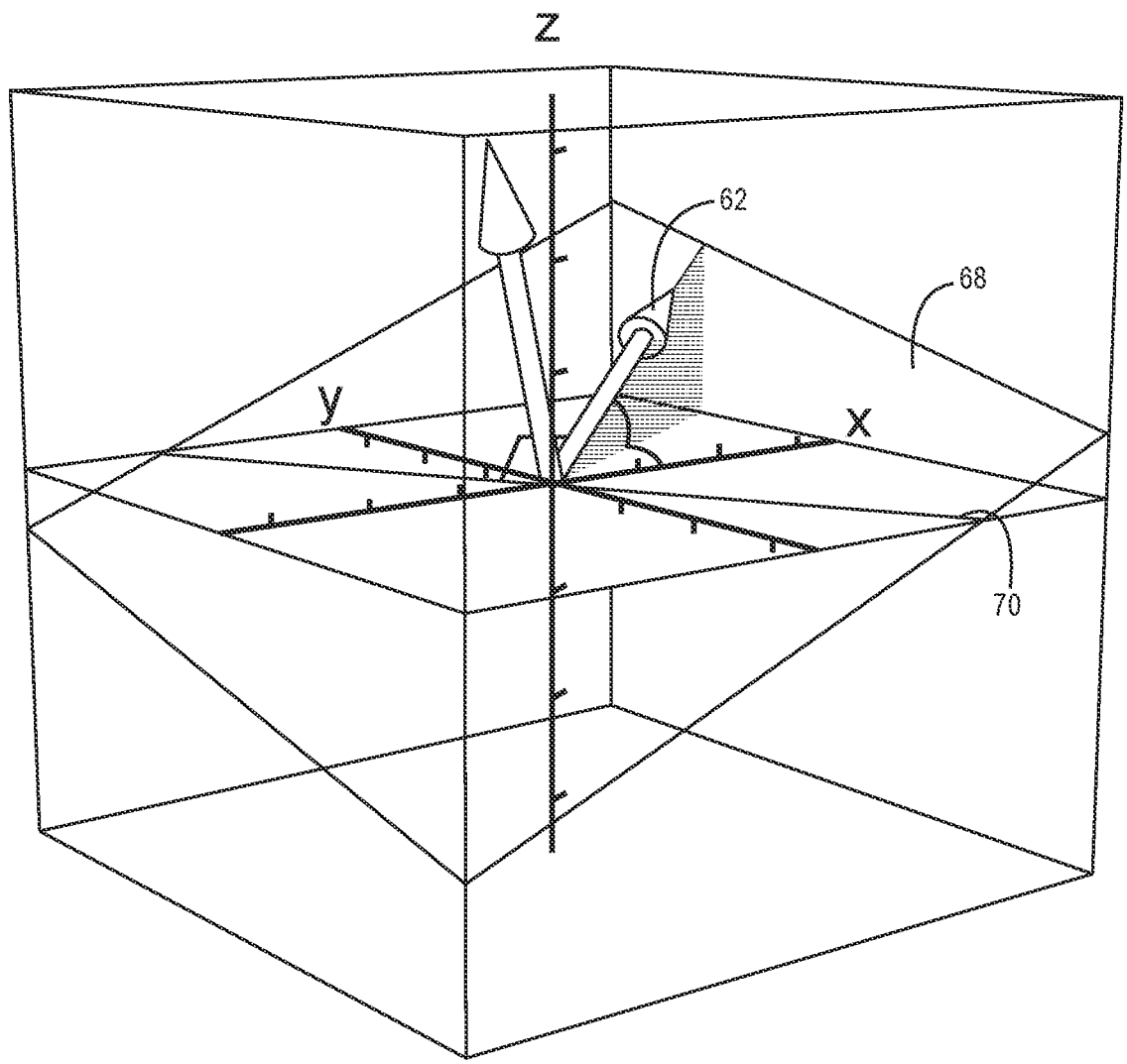
FIG. 11A illustrates a cut plane for a quartz carrier substrate having the first crystal direction of FIG. 10.

In some embodiments, a SAW device includes a quartz carrier substrate with a crystal orientation and propagation direction that provides improvements for K2, Q, TCF, and delta TCF parameters. In that regard, FIG. 10 illustrates propagation directions for a bulk quartz crystal that have the second fastest maximum of slow shear velocity. As previously described, the Z-propagation direction is fastest. FIG. 10 includes a first crystal direction 62, a second crystal direction 64, and a third crystal direction 66 that are all equivalent to each other due to symmetry of the quartz crystal. The first crystal direction 62, second crystal direction 64, and third crystal direction 66 each comprise a same angle A from the XY crystal plane. Additionally, the first crystal direction 62 and the third crystal direction 66 comprise a same angle B that is offset from the XZ crystal plane while the second crystal direction 64 is aligned with the YZ crystal plane. In some embodiments, the angle A is about 23.69° and the angle B is about 30° to provide the first crystal direction 62, the second crystal direction 64, and the third crystal direction 66 that all have the second fastest maximum of slow shear velocity. In some embodiments, the angle A is in a range between about 10° and about 35° from the XY crystal plane. In further embodiments, the angle A is in a range between about 18° and about 27° from the XY crystal plane. In some embodiments, the angle B is in a range between about 20° and 40°, or between about 25° and 35°. A quartz carrier substrate may be characterized according to the crystal plane from which it was cut. For example, a Y-cut quartz crystal has been cut along the Y-face of the crystal, i.e., along the XZ plane and normal to the Y-axis of the crystal. A quartz carrier substrate may be characterized as rotated Y-cut if the cut plane is rotated from the XZ plane along the X axis. Accordingly, a quartz carrier substrate that was cut along a plane that includes the first crystal direction 62, the second crystal direction 64, or the third crystal direction 66 may be characterized as having a rotated Y-cut crystalline orientation. For embodiments where the angle A comprises a range between about 10° and about 35° from the XY crystal plane, a corresponding quartz carrier substrate may be characterized as 55° to 80° rotated Y-cut. For embodiments where the angle A comprises a range between about 18° and about 27° from the XY crystal plane, a corresponding quartz carrier substrate may be characterized as 63° to 72° rotated Y-cut. For embodiments where the angle A comprises about 23.69° from the XY crystal plane, a corresponding quartz carrier substrate may be characterized as 66.31° rotated Y-cut. FIG. 11A illustrates a cut plane 68 for a quartz carrier substrate having the first crystal direction 62 of FIG. 10. The crystalline orientation of the cut plane 68 and the propagation direction may be defined in terms of Euler angles, which characterizes a three-dimensional orientation of the cut plane 68 relative to the original XY plane and the propagation direction. For example, the crystalline orientation of the cut plane 68 may be characterized by Euler angles (α, β, γ) which define a set of three rotations, where α is an angle of a first rotation about the Z-axis, β is an angle of a second rotation about the now rotated X-axis (or X'), and γ is an angle of a third rotation about the now rotated Z-axis (Z'). Additionally, a node line 70 defines the intersection between the cut plane 68 and the original XY plane, and Euler angle α defines the angle between original X-axis and the node line 70, Euler angle β defines the angle between the original Z-axis and the rotated Z-axis, and Euler angles γ defines the angle between the node line 70 and the rotated X-axis. In some embodiments, a front side (or the +Z axis side) of the cut plane 68 for the first crystal direction 62 comprises Euler angles (−60°, 23.69°, 90°). A backward direction, or 180° from the first crystal direction 62 on the front side of the cut plane 68 comprises Euler angles (−60°, 23.69°, −90°). A backside (or the −Z axis side) of the cut plane 68 for the first crystal direction 62 comprises Euler angles (−60°, −156.31°, −90°). A backward direction, or 180° from the first crystal direction 62 on the backside of the cut plane 68 comprises Euler angles (−60°, −156.31°, 90°). In that regard, a SAW device may comprise a quartz carrier substrate comprising a crystalline orientation of 66.31° rotated Y-cut with a 90° X-propagation direction. In some embodiments, the propagation direction may deviate from 90° X-propagation. For example, an X-propagation direction range may include 75° to 105°, or 80° to 100°, or 87° to 93°. In that regard, a SAW device may comprise a quartz carrier substrate comprising a crystalline orientation in the range of 55° to 80° rotated Y-cut with a 75° to 105° X-propagation direction range, or a crystalline orientation in the range of 63° to 72° rotated Y-cut with a 75° to 105° X-propagation direction, or a crystalline orientation in the range of 55° to 80° rotated Y-cut with an 80° to 100° X-propagation direction range, or a crystalline orientation in the range of 55° to 80° rotated Y-cut with an 87° to 93° X-propagation direction range.

In FIG. 11A, the crystalline orientation of the cut plane 68 and the propagation direction may comprise Euler angles that deviate from the Euler angles (−60°, 23.69°, 90°). In some embodiments, the quartz carrier substrate comprises a crystalline orientation having Euler angles (α, β, γ), where α is in a range of −55° to −65°, β is in a range of 18° to 28°, and γ is in a range of 85° to 95°.

Figure 11B:
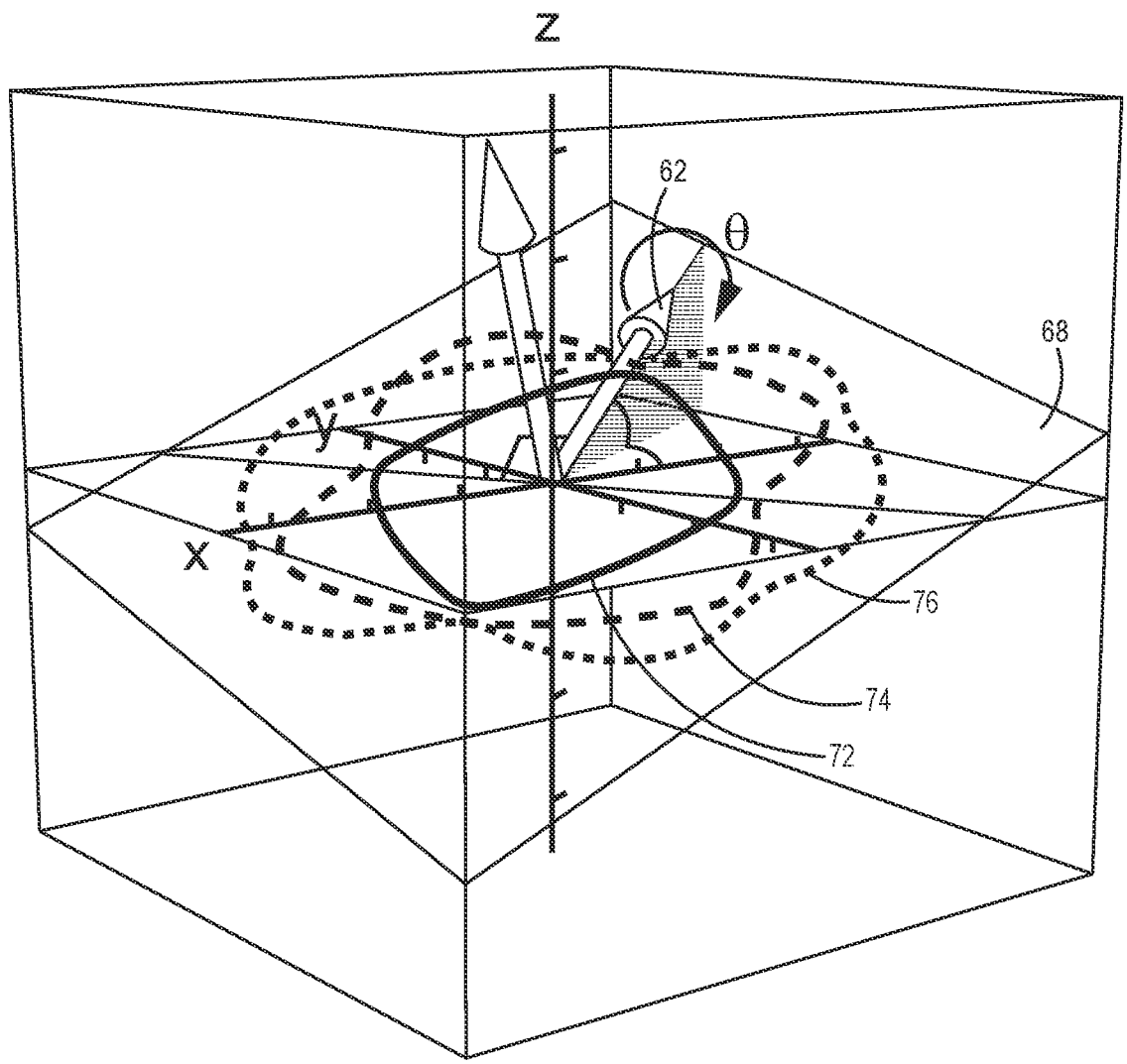
FIG. 11B illustrates slowness curves of the bulk acoustic modes for propagation directions in the cut plane of a quartz carrier substrate having the first crystal direction of FIG. 10.

FIG. 11B illustrates slowness curves of the bulk acoustic modes for propagation directions in the cut plane 68 of a quartz carrier substrate comprising the first crystal direction 62 of FIG. 10. The rotation angle θ represents a rotation angle along the first crystal direction 62. The slowness curves include a longitudinal wave 72, a fast shear wave 74, and a slow shear wave 76. As shown, the first crystal direction 62 comprises the fastest slow shear velocity for the cut plane 68. In particular, the velocity along the first crystal direction 62 may comprise a value of at least 4620 m/s, which is the second maximum value only to the velocity for Z-propagation.

Figure 12A:
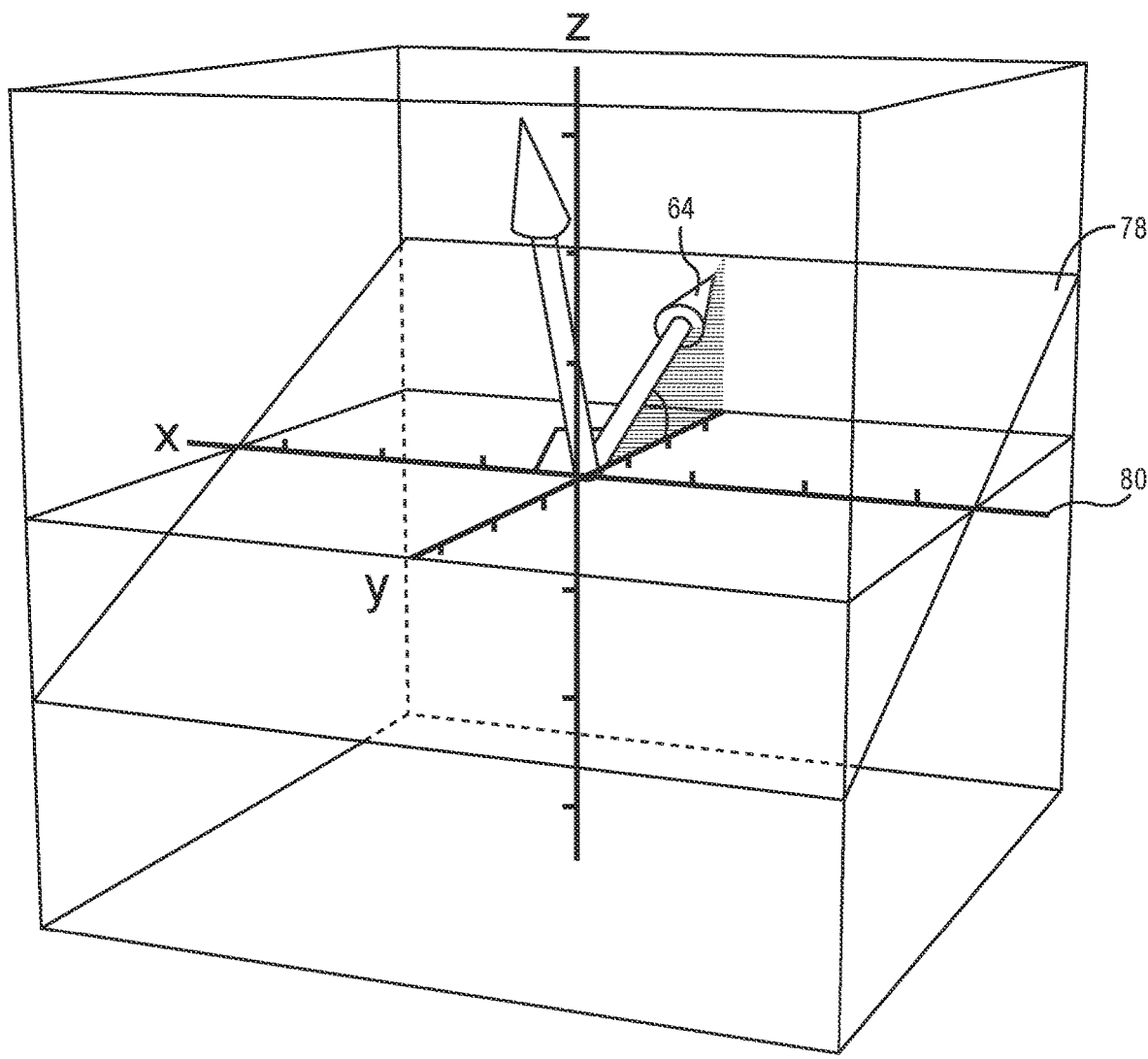
FIG. 12A illustrates a cut plane for a quartz carrier substrate having the second crystal direction of FIG. 10.

FIG. 12A illustrates a cut plane 78 for a quartz carrier substrate having the second crystal direction 64 of FIG. 10. As previously described, due to symmetry of the quartz crystal, the second crystal direction 64 is equivalent to the first crystal direction 62. A node line 80 defines the intersection between the cut plane 78 and the original XY plane. For the cut plane 78, the node line 80 corresponds to the original X-axis. In some embodiments, a front side (or the +Z axis side) of the cut plane 78 for the second crystal direction 64 comprises Euler angles (0°, −23.69, −90°). A backward direction, or 180° from the second crystal direction 64 on the front side of the cut plane 78 comprises Euler angles (0°, −23.69°, 90°). A backside (or the −Z axis side) of the cut plane 78 for the second crystal direction 64 comprises Euler angles (0°, 156.31°, 90°). A backward direction, or 180° from the second crystal direction 64 on the backside of the cut plane 78 comprises Euler angles (0°, 156.31°, −90°). The second crystal direction 64 corresponds to a propagation direction that may be characterized as 90° X-propagation. The crystalline orientation of the cut plane 78 may comprise Euler angles that deviate from the Euler angles listed above. For example, in some embodiments for the second crystal direction 64 on the front side, the quartz carrier substrate comprises a crystalline orientation having Euler angles (α, β, γ), where α is in a range of −5° to 5°, β is in a range of −18° to −28°, and γ is in a range of −85° to −95°.

Figure 12B:
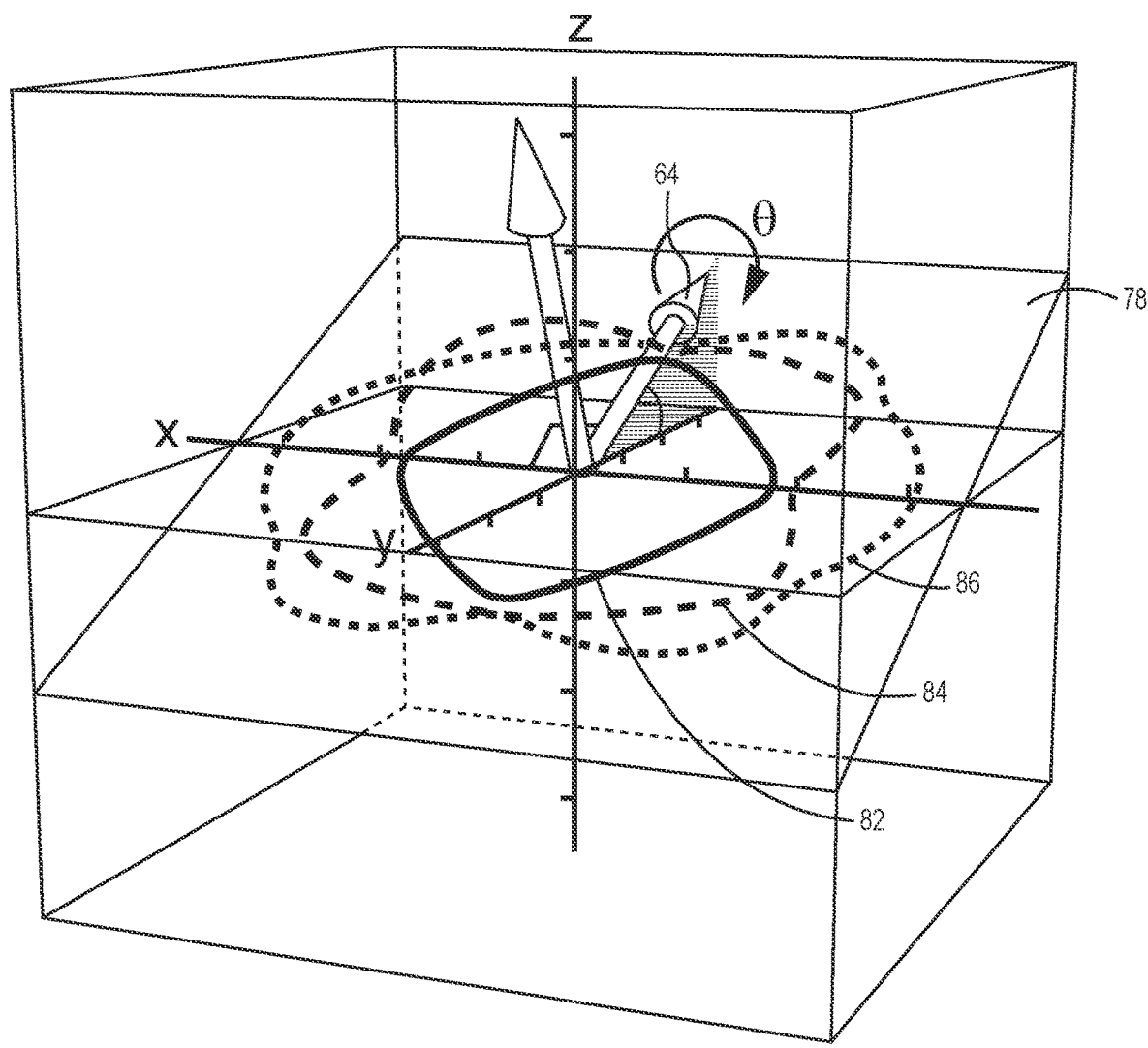
FIG. 12B illustrates slowness curves of the bulk acoustic modes for propagation directions in the cut plane of a quartz carrier substrate having the second crystal direction of FIG. 10.

FIG. 12B illustrates slowness curves of the bulk acoustic modes for the propagation directions in the cut plane 78 of a quartz carrier substrate comprising the second crystal direction 64 of FIG. 10. The rotation angle θ represents a rotation angle along the second crystal direction 64. The slowness curves include a longitudinal wave 82, a fast shear wave 84, and a slow shear wave 86. As shown, the second crystal direction 64 comprises the fastest slow shear velocity for the cut plane 78. In particular, the velocity along the second crystal direction 64 may comprise a value of at least 4620 m/s, which is equivalent to the first crystal direction 62 and is the second maximum value only to the velocity for Z-propagation.

Figure 13A:
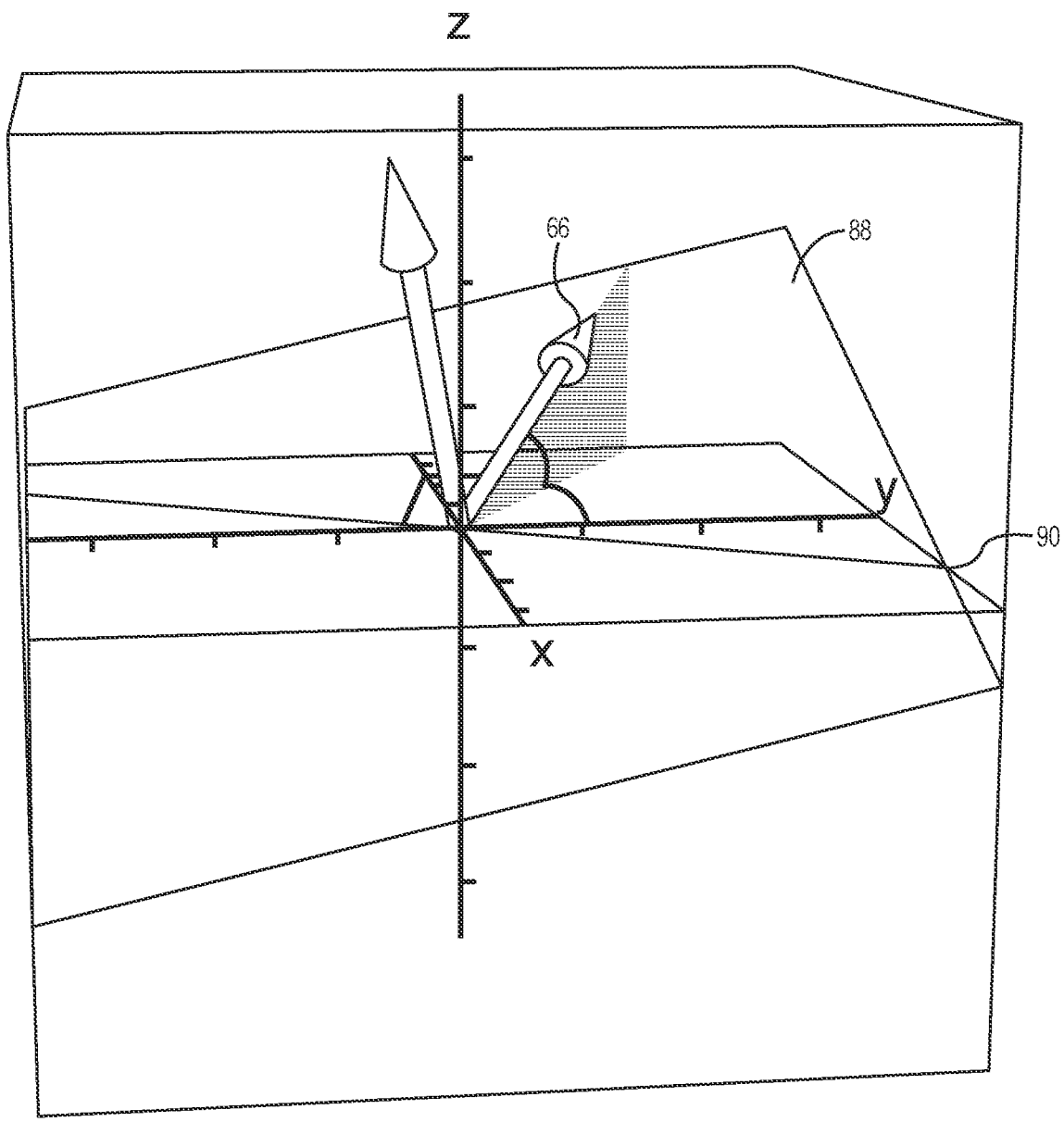
FIG. 13A illustrates a cut plane for a quartz carrier substrate having the third crystal direction of FIG. 10.

FIG. 13A illustrates a cut plane 88 for a quartz carrier substrate having the third crystal direction 66 of FIG. 10. As previously described, due to symmetry of the quartz crystal, the third crystal direction 66 is equivalent to the first crystal direction 62 and the second crystal direction 64. A node line 90 defines the intersection between the cut plane 88 and the original XY plane. In some embodiments, a front side (or the +Z axis side) of the cut plane 88 for the third crystal direction 66 comprises Euler angles (60°, 23.69°, 90°). A backward direction, or 180° from the third crystal direction 66 on the front side of the cut plane 88 comprises Euler angles (60°, 23.69°, −90°). A backside (or the −Z axis side) of the cut plane 88 for third crystal direction 66 comprises Euler angles (60°, −156.31°, −90°). A backward direction, or 180° from the third crystal direction 66 on the backside of the cut plane 88 comprises Euler angles (60°, −156.31°, 90°). The crystalline orientation of the cut plane 88 may comprise Euler angles that deviate from the Euler angles listed above. For example, in some embodiments for the third crystal direction 66 on the front side of the cut plane 88, the quartz carrier substrate comprises a crystalline orientation having Euler angles (α, β, γ), where α is in a range of 55° to 65°, β is in a range of 18° to 28°, and γ is in a range of 85° to 95°.

Figure 13B:
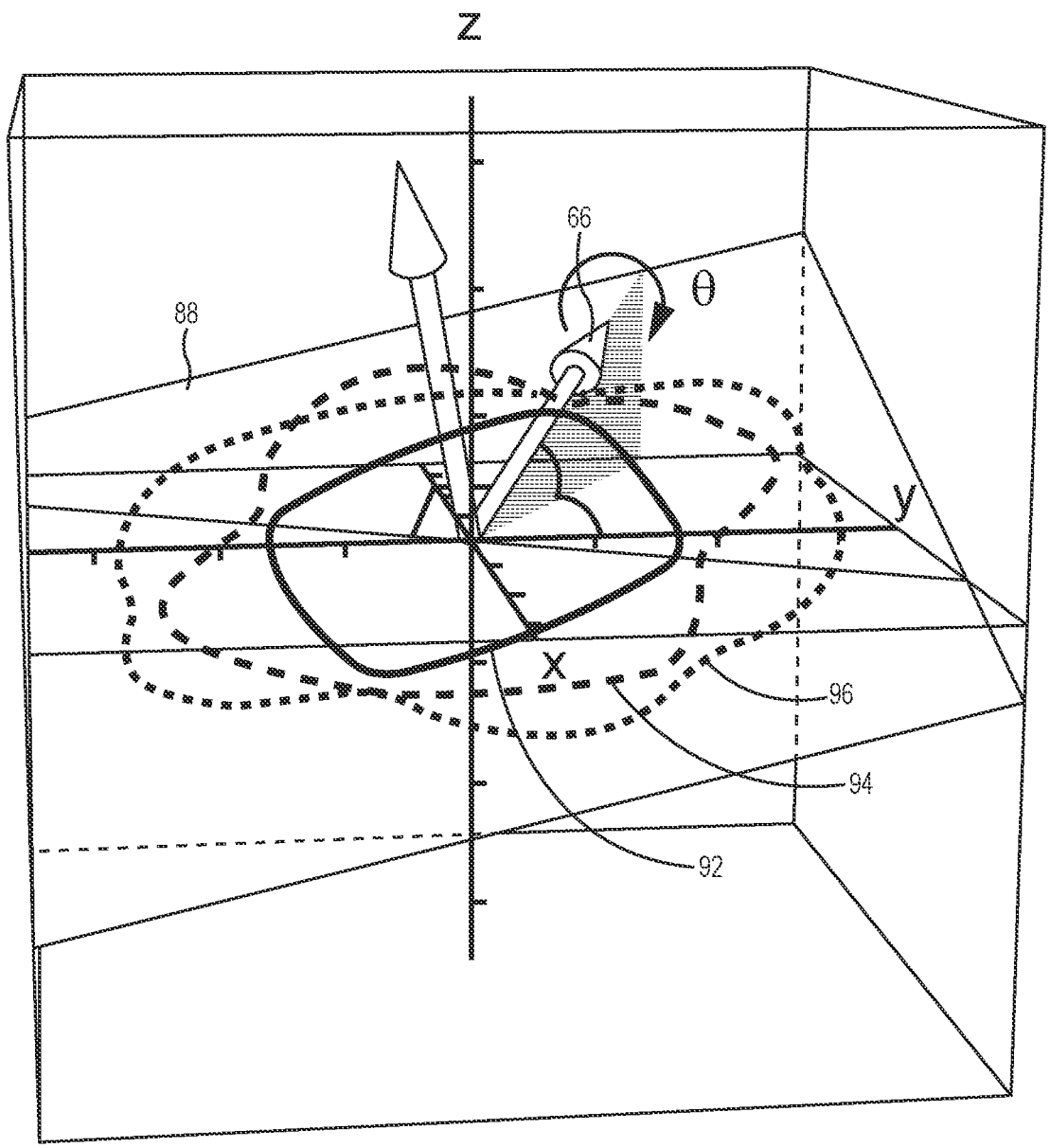
FIG. 13B illustrates slowness curves of the bulk acoustic modes for the propagation directions in cut plane of a quartz carrier substrate having the third crystal direction of FIG. 10.

FIG. 13B illustrates slowness curves of the bulk acoustic modes for the propagation directions in the cut plane 88 of a quartz carrier substrate comprising the third crystal direction 66 of FIG. 10. The rotation angle θ represents a rotation angle along the third crystal direction 66. The slowness curves include a longitudinal wave 92, a fast shear wave 94, and a slow shear wave 96. As shown, the third crystal direction 66 comprises the fastest slow shear velocity for the cut plane 88. In particular, the velocity along third crystal direction 66 may comprise a value of at least 4620 m/s, which is equivalent to the first crystal direction 62 and the second crystal direction 64 and is the second maximum value only to the velocity for Z-propagation.

FIGS. 14A-14D compare the simulation results of FIGS. 9A-9D for the LT/Z-propagation SAW device and the LT-only SAW device with simulation results for a SAW device that includes a Y+42° LT piezoelectric layer on a quartz substrate with a propagation direction along the first crystal direction 62, the second crystal direction 64, or the third crystal direction 66 (LT/1,2,3-propagation) of FIG. 10. The simulation results are plotted by the rotation angle θ. The rotation angle θ for the LT/Z-propagation SAW device is along the Z-axis while the rotation angle θ for the LT/1,2, 3-propagation SAW device is along the first crystal direction 62, the second crystal direction 64, or the third crystal direction 66 of FIG. 10.

Figure 14A:
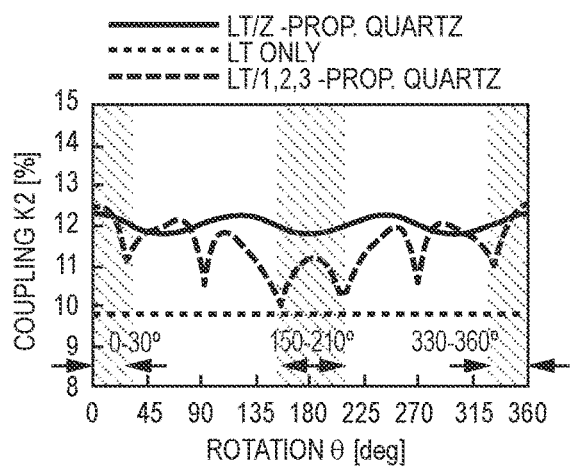
FIG. 14A is a plot comparing the K2 factors of the LT/Z-propagation SAW device, the LT-only SAW device, and a LT/1,2,3-propagation SAW device across the rotation angle $\theta$.

FIG. 14A is a plot comparing the K2 factors of the LT/Z-propagation SAW device, the LT-only SAW device, and the LT/1,2,3-propagation SAW device across rotation angle θ. As illustrated in FIG. 14A, the LT/1,2,3-propagation SAW device has a K2 factor that is notably higher than that of the LT-only SAW device and is also higher across certain rotation angles θ, including ranges of about 0° to 30° and 330° to 360°, than that of the LT/Z-propagation SAW device.

Figure 14B:
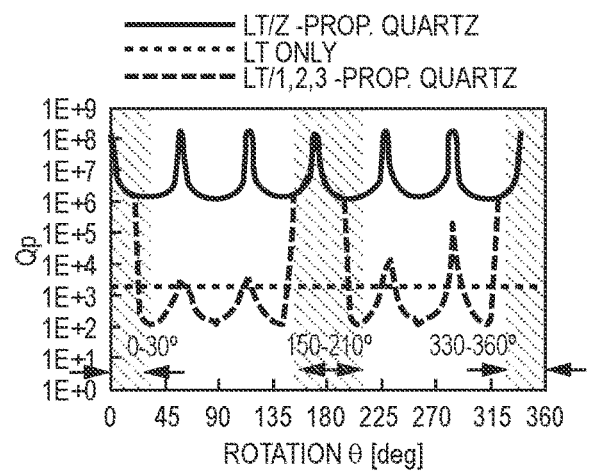
FIG. 14B is a plot comparing the Q factor of the LT/Z-propagation SAW device, the LT-only SAW device, and the LT/1,2,3-propagation SAW device across the rotation angle $\theta$.

FIG. 14B is a plot comparing the Q factor of the LT/Z-propagation SAW device, the LT-only SAW device, and the LT/1,2,3-propagation SAW device across the rotation angle θ. As shown, the Q factor for the LT/1,2,3-propagation SAW device is only higher than that of the LT-only SAW device for certain ranges of the rotation angle θ. For example, the Q factor is higher when the rotation angle θ includes the range of about 0° to 30°, or a range of about 150° to 210°, or the range of about 330° to 360° due to crystalline orientations having high velocities which lead to wave guiding effects. As previously described, the propagation direction for the quartz carrier substrate of the LT/1,2,3-propagation SAW device may comprise a 90° X-propagation direction. In some embodiments, the propagation direction for the quartz carrier substrate of the LT/1,2,3-propagation SAW device may comprise a range of about 75° to 105°. Accordingly, a SAW device may comprise a quartz substrate with a crystalline orientation that is rotated along the 75° to 105° X-propagation direction in a range of 0° to 30°, or in a range of 150° to 210°, or in a range of 330° to 360°.

Figure 14C:
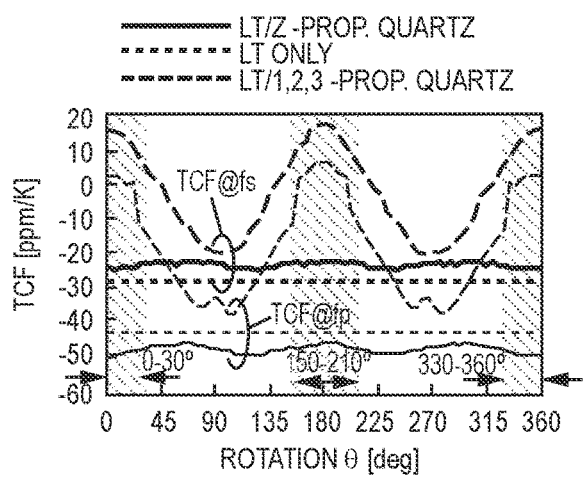
FIG. 14C is a plot comparing the TCF of the LT/Z-propagation SAW device, the LT-only SAW device, and the LT/1,2,3-propagation SAW device across the rotation angle $\theta$ for both the resonance frequency and the antiresonance frequency.

FIG. 14C is a plot comparing the TCF of the LT/Z-propagation SAW device, the LT-only SAW device, and the LT/1,2,3-propagation SAW device across the rotation angle θ for both the resonance frequency, fs, and the antiresonance frequency, fp. As shown, the TCF of the LT/1,2,3-propagation SAW device is notably improved over both that of the LT/Z-propagation SAW device and the LT-only SAW device for the rotation angle θ ranges of about 0° to 30°, or about 150° to 210°, or about 330° to 360°, which are the same ranges that provide the highest Q factors.

Figure 14D:
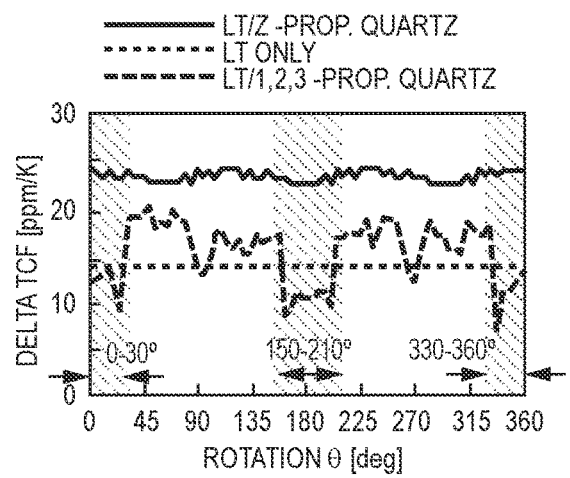
FIG. 14D is a plot comparing the delta TCF of the LT/Z-propagation SAW device, the LT-only SAW device, and the LT/1,2,3-propagation SAW device across the rotation angle $\theta$.

FIG. 14D is a plot comparing the delta TCF of the LT/Z-propagation SAW device, the LT-only SAW device, and the LT/1,2,3-propagation SAW device across the rotation angle θ. As illustrated, the delta TCF of the LT/1,2,3-propagation SAW device is notably improved, or lower, compared to that of the LT/Z-propagation SAW device for all rotation angles θ. Additionally, the delta TCF of the LT/1,2,3-propagation SAW device is lower than that of the LT-only SAW device for the rotation angles θ ranges of about 0° to 30°, or about 150° to 210°, or about 330° to 360°, which are the same ranges that provide the highest Q factors. Accordingly, for a quartz carrier substrate that comprises a crystalline orientation in the range of 55° to 80° rotated Y-cut with a 75° to 105° X-propagation direction range, an example of which is 66.31° rotated Y-cut with a 90° X-propagation direction, the crystalline orientation may be rotated along the propagation direction in a range of 0° to 30°, or in a range of 150° to 210°, or in a range of 330° to 360° to provide notably improved performance parameters of K2, Q, TCF, and delta TCF.

Figure 15:
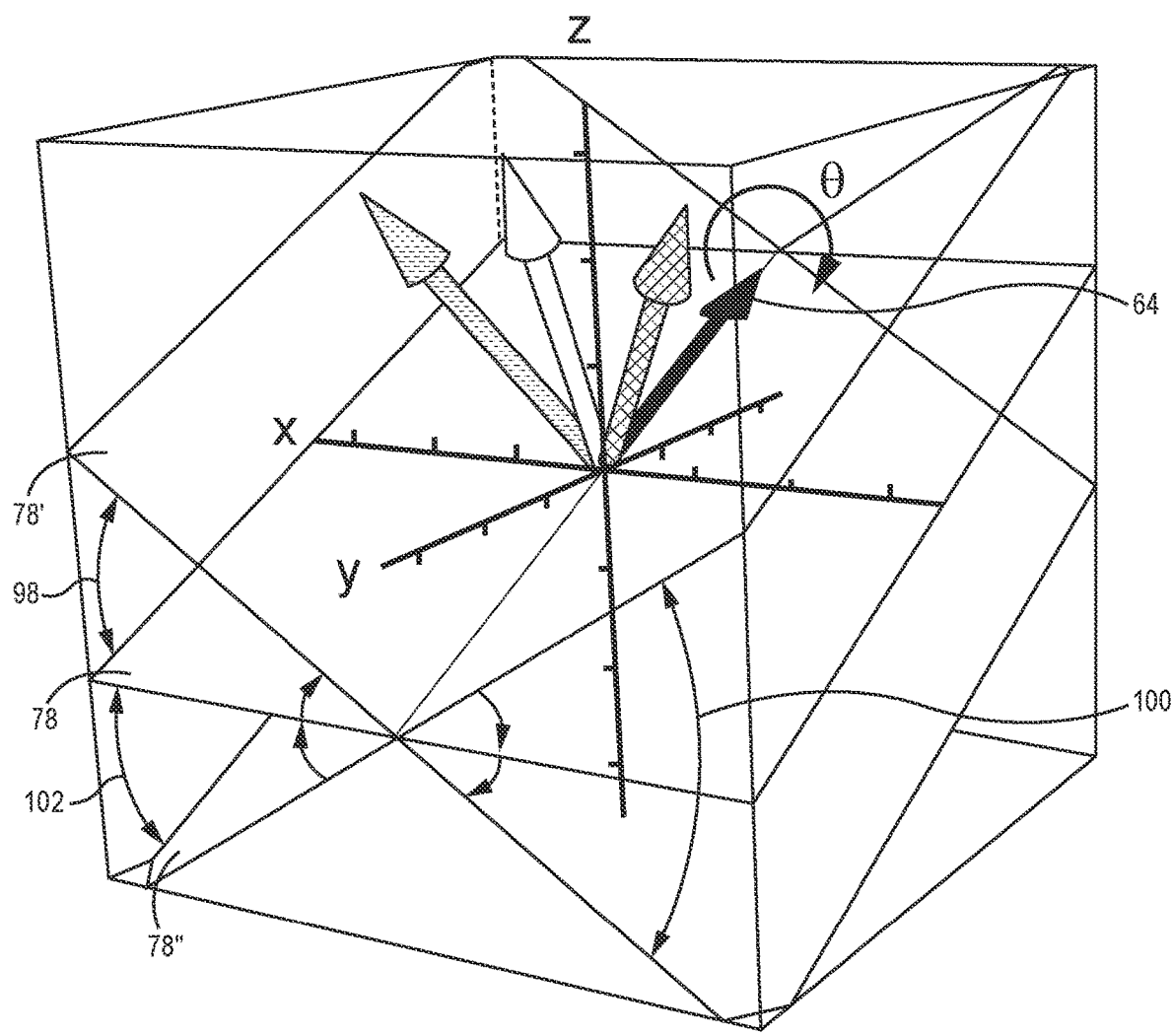
FIG. 15 illustrates the rotation angle $\theta$ ranges with improved performance parameters for the cut plane having the second crystal direction of FIG. 10.

FIG. 15 illustrates the rotation angle θ ranges with improved performance parameters for the cut plane 78 having the second crystal direction 64 of FIG. 10. In FIG. 15, the cut plane 78 represents a rotation angle θ of 0°, cut plane 78' represents a rotation angle θ of 30° along the second crystal direction 64, and cut plane 78'' represents a rotation angle θ of 150° along the second crystal direction 64. Accordingly, the rotation angle θ ranges are illustrated as a first range 98 that includes 0° to 30°, a second range 100 that includes 150° to 210°, and a third range 102 that includes 330° to 360°. As previously described, the second crystal direction 64 is equivalent to the first crystal direction 62 and the third crystal direction 66 due to symmetry of the quartz crystal. Accordingly, these rotation angle θ ranges 98, 100, and 102 may be equally applicable to the first crystal direction 62 and the third crystal direction 66 of FIG. 10.

Figure 16:
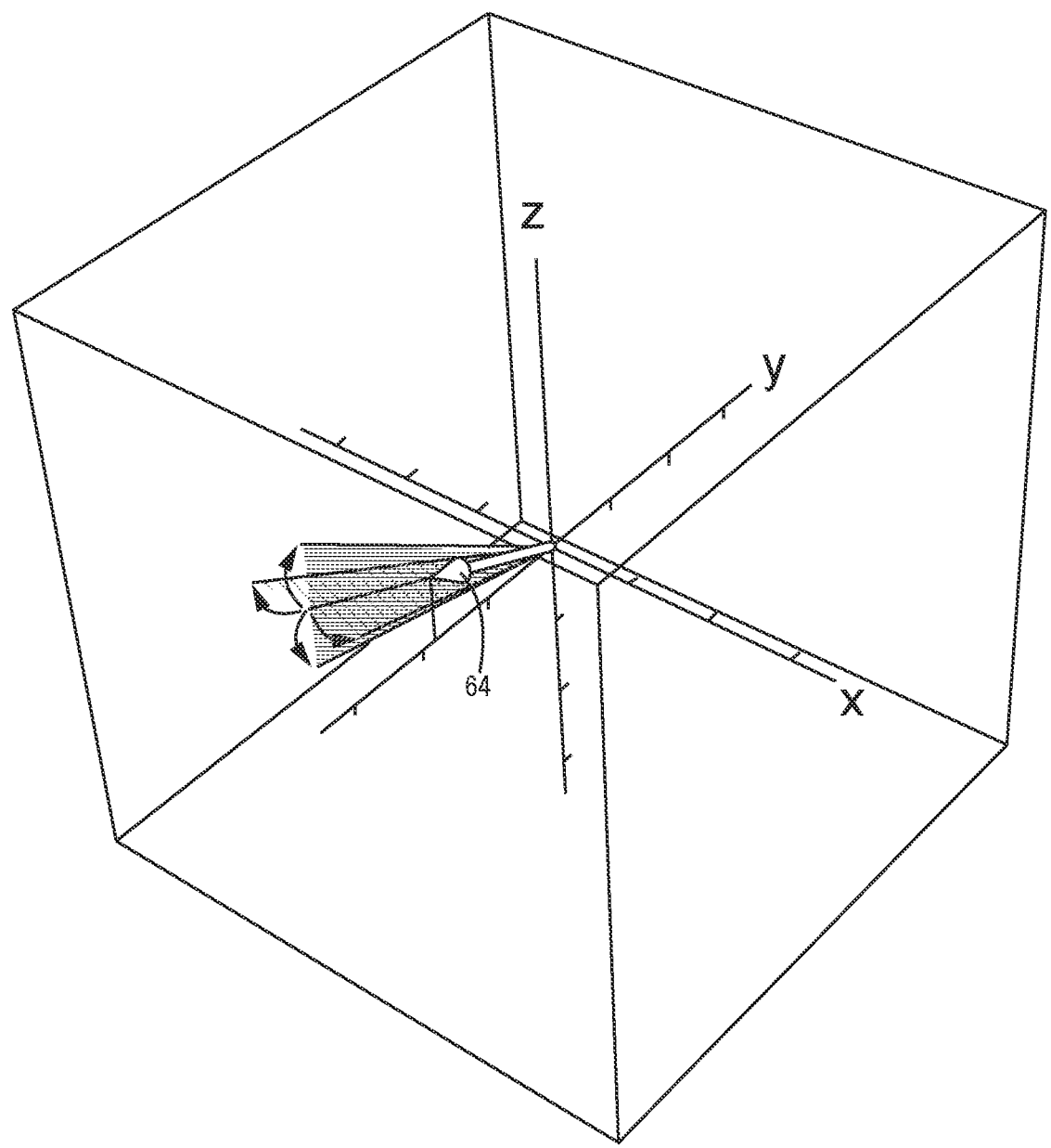
FIG. 16 illustrates a range of directions for the second crystal direction of FIG. 10.

As described above, a SAW device including a quartz carrier substrate with a 66.31° rotated Y-cut crystalline orientation with a 90° X-propagation direction includes the second fastest maximum of bulk acoustic velocity and an improved combination of performance parameters K2, Q, TCF, and delta TCF. The cut plane of the quartz carrier substrate of a SAW device may comprise some deviation from the 66.31° rotated Y-cut orientation and 90° X-propagation direction and still provide a fast enough bulk acoustic velocity to provide the improved combination of performance parameters K2, Q, TCF, and delta TCF. In that manner, FIG. 16 illustrates a range of directions for the second crystal direction 64 of FIG. 10. As previously described, the second crystal direction 64 may comprise an angle of about 23.69° from the XY crystal plane while being aligned with the YZ crystal plane. As illustrated in FIG. 16, the second crystal direction 64 may deviate from this orientation in any direction. In some embodiments, the deviation comprises no more than about 10° in any direction. Accordingly, a SAW device may include a quartz carrier substrate that is in the range of 55° to 80° rotated Y-cut in some embodiments, or in the range of 60° to 80° rotated Y-cut in some embodiments, or in the range of 65° to 80°. For example, in some embodiments, a SAW device includes a quartz carrier substrate having a 69° rotated Y-cut with a 90° X-propagation direction.

As discussed above, a SAW device may include a piezoelectric layer on a quartz carrier substrate. If the bulk acoustic velocity of the quartz carrier substrate in the direction of propagation of the SAW is larger than the velocity of the (pseudo) SAW device, then it is possible to guide the acoustic energy inside the piezoelectric layer, and any loss into the bulk can be cancelled. In other words, it is desirable for the bulk acoustic velocity of the quartz carrier substrate in the direction of propagation of the SAW to be as high as possible compared to the velocity of the SAW device.

FIGS. 17A and 17B illustrate the relative position of a bulk cut-off frequency for a first SAW device 104 where acoustic energy is guided inside a piezoelectric layer and a second SAW device 106 where acoustic energy radiates into the bulk of a quartz carrier substrate. FIG. 17A represents the first SAW device 104 that comprises an IDT 108, a piezoelectric layer 110 of LT with an orientation of 42°, and a carrier substrate 112 comprising quartz with an orientation having 69° rotated Y-cut with a 90° X-propagation direction. The first SAW device 104 is configured to have a bulk cut-off frequency 114 that is at least 1.07 times greater than the resonance frequency fs. Accordingly, acoustic energy 116 is reflected and guided inside the piezoelectric layer 110 at the resonance frequency. FIG. 17B represents the second SAW device 106 that comprises an IDT 118, a piezoelectric layer 120 of LT with an orientation of 42°, and a carrier substrate 122 comprising quartz with an orientation having 42° rotated Y-cut with a 90° X-propagation direction. Notably, the second SAW device 106 is configured to have a bulk cut-off frequency 124 that is less than 1.07 times the resonance frequency fs. Accordingly, acoustic energy 126 radiates into the carrier substrate 122 as a bulk wave, and the second SAW device 106 comprises a low Q at the resonance frequency. In this manner, it is desirable for a SAW device to be configured to satisfy the inequality 1.07×fs≤fc, where fs is the resonance frequency and fc is the bulk cut-off frequency. In further embodiments, a SAW device may be configured to satisfy the inequality 1.08×fs≤fc, or 1.09×fs≤fc, or 1.10×fs≤fc, or 1.11×fs≤fc.

Figure 18:
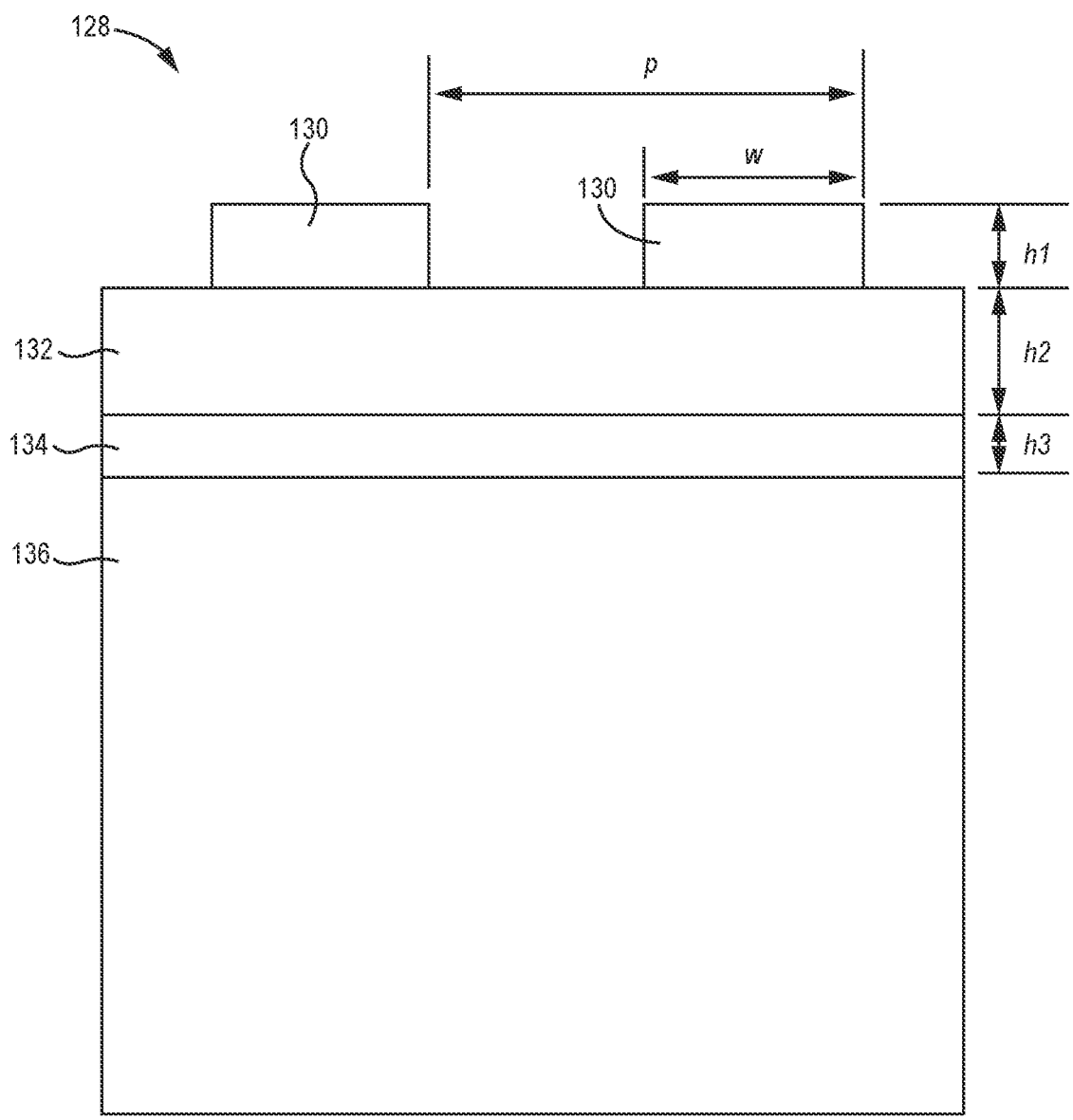
FIG. 18 represents a SAW device according to some embodiments.

FIG. 18 represents a SAW device 128 according to some embodiments. The SAW device 128 comprises IDT electrodes 130 comprising Aluminum (Al), a piezoelectric layer 132 of LT with an orientation of 42°, a dielectric layer 134 comprising $SiO_2$, and a carrier substrate 136 comprising quartz with an orientation having 66.31° rotated Y-cut with a 90° X-propagation direction. The IDT electrodes 130 comprise a spacing or pitch p, a width w, a thickness h1, and a duty factor, or DF, that is about w/p (0.5). A center-frequency wavelength λ is 2p and the thickness h1 is about 0.1λ. The piezoelectric layer 132 comprises a thickness h2 of about 0.15λ, and the dielectric layer 134 comprises a thickness h3 of about 0.0λ (indicating the dielectric layer 134 is optional in some embodiments). In order to determine the parameter ranges for geometry and orientation for the SAW device 128 to satisfy the inequality 1.07×fs≤fc, simulations were conducted with variable parameters using a model of the SAW device 128. The parameter values listed above are center or initial values used for the simulation results.

FIG. 19A is a plot representing simulation results for a normalized resonance frequency fs as a function of a rotation angle θ1 of the quartz carrier substrate 136 of FIG. 18. The rotation angle θ1 is varied from a center rotation of 66.31°. The fs is normalized by the resonance frequency when all parameters are at their center or initial values. The simulation results may be represented as Function (1) below.

$$fs=F1(\theta1)=-1.9118\times10^{-5}\theta1^2+1.2926\times10^{-3}\theta1+9.9800\times10^{-1} \quad (1)$$

FIG. 19B is a plot representing simulation results for the normalized fs as a function of a rotation angle θ2 of the piezoelectric layer 132 of FIG. 18. The rotation angle θ2 is varied from the LT orientation of 42°. The fs is normalized by the resonance frequency when all parameters are at their center or initial values. The simulation results may be represented as Function (2) below.

$$fs=F2(\theta2)=4.3337\times10^{-14}\theta2^6-4.0011\times10^{-11}\theta2^5+1.2031\times10^{-8}\theta2^4-1.4033\times10^{-6}\theta2^3+4.6659\times10^{-5}\theta2^2+6.9837\times10^{-4}\theta2+9.6029\times10^{-1} \quad (2)$$

FIG. 19C is a plot representing simulation results for the normalized fs as a function of the thickness h3 (relative to λ) of the dielectric layer 134 of FIG. 18. The thickness h3 is varied from the value of 0.0λ. The fs is normalized by the resonance frequency when all parameters are at their center or initial values. The simulation results may be represented as Function (3) below.

$$fs=F3(h3)=-8.0286\times10^{-1}h3^3+6.3578\times10^{-1}h3^2-2.1829\times10^{-1}h3+9.9982\times10^{-1} \quad (3)$$

FIG. 19D is a plot representing simulation results for the normalized fs as a function of the rotation angle θ2 of the piezoelectric layer 132 of FIG. 18 for a SAW device that does not include a quartz substrate, i.e. a LT-only SAW device. The rotation angle θ2 is varied from the LT orientation of 42°. The fs is normalized by the resonance frequency when all parameters are at their center or initial values. The simulation results may be represented as Function (4) below.

$$fs=F4(\theta2)=-1.5897\times10^{-13}\theta2^6+5.4976\times10^{-11}\theta2^5-3.4318\times10^{-9}\theta2^4-3.6252\times10^{-7}\theta2^3+1.5352\times10^{-5}\theta2^2+1.2964\times10^{-3}\theta2+9.8834\times10^{-1} \quad (4)$$

Figure 19E:
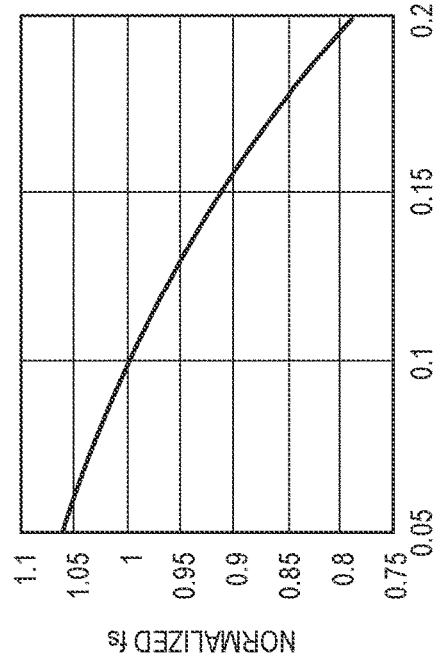
FIG. 19E is a plot representing simulation results for normalized fs as a function of the thickness h2 of the piezoelectric layer of FIG. 18.

FIG. 19E is a plot representing simulation results for the normalized fs as a function of the thickness h2 (relative to λ) of the piezoelectric layer 132 of FIG. 18. The thickness h2 is varied from the value of 0.15λ. The fs is normalized by the resonance frequency when all parameters are at their center or initial values. The simulation results may be represented as Function (5) below.

When $h2 < 0.7\lambda$, $$fs = F5(\theta1, \theta2, h2, h3) = \{F4(\theta2) - F1(\theta1)F2(\theta2)F3(h3)\}$$

$$\text{Sign}\left(\sin\frac{h2-0.15}{0.55}\frac{\pi}{2}\right)\times\left|\sin\frac{h2-0.15}{0.55}\frac{\pi}{2}\right|^{0.8} + F1(\theta1)F2(\theta2)F3(h3)$$

When $h2 \geq 0.7\lambda$, $$fs = F5(\theta2) = F4(\theta2)$$

Figure 19F:
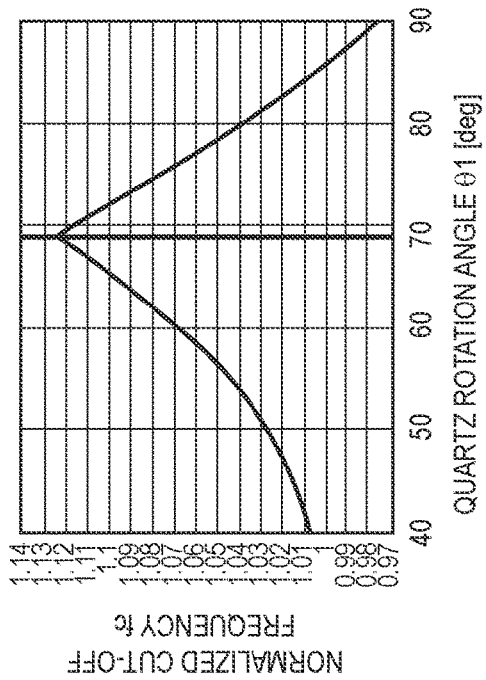
FIG. 19F is a plot representing simulation results for normalized fs as a function of the thickness h1 of the IDT electrodes of FIG. 18.

FIG. 19F is a plot representing simulation results for the normalized fs as a function of the thickness h1 (relative to λ) of the IDT electrodes 130 of FIG. 18. The thickness h1 is varied from the value of 0.1λ. The fs is normalized by the resonance frequency when all parameters are at their center or initial values. The simulation results may be represented as Function (6) below.

$$fs=F6(h1)=-5.6650h1^2-3.8177\times10^{-1}h1+1.0931 \quad (6)$$

Figure 19G:
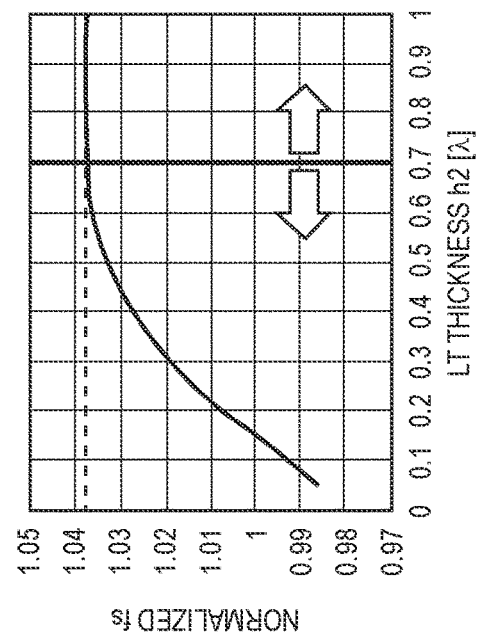
FIG. 19G is a plot representing simulation results for normalized fs as a function of the duty factor DF of the IDT electrodes of FIG. 18.

FIG. 19G is a plot representing simulation results for the normalized fs as a function of the duty factor DF of the IDT electrodes 130 of FIG. 18 defined as the ratio of the electrode width (w) to the electrode pitch (p). The duty factor DF is varied from w/p(0.5). The fs is normalized by the resonance frequency when all parameters are at their center or initial values. The simulation results may be represented as Function (7) below.

$$fs=F7(DF)=2.8222\times10^{-1}DF^2-3.7921\times10^{-1}DF+1.1190 \quad (7)$$

Figure 19H:
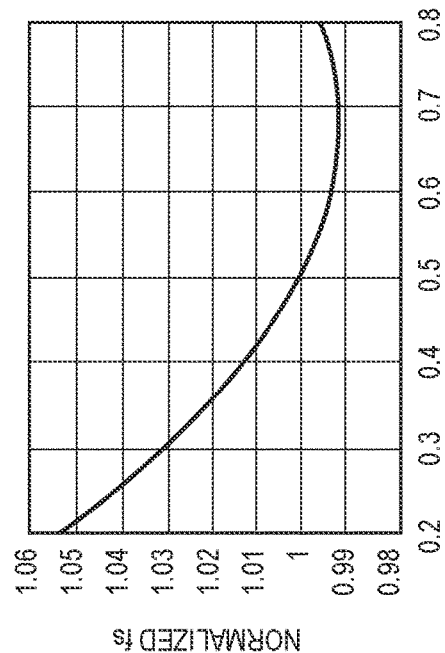
FIG. 19H is a plot representing simulation results for normalized cut-off frequency fc as a function of the rotation angle $\theta 1$ of the quartz carrier substrate of FIG. 18.

FIG. 19H is a plot representing simulation results for a normalized cut-off frequency fc as a function of the rotation angle θ1 of the quartz carrier substrate 136 of FIG. 18. The rotation angle θ1 is varied from a center rotation of 66.31°. The fc is normalized by the resonance frequency when all parameters are at their center or initial values. The simulation results may be represented as Function (8) below.

When $\theta1 \leq 69°$, $$fc=F8(\theta1)=1.1577\times10^{-4}\theta1^2-8.5663\times10^{-3}\theta1+1.1660$$

When $\theta1 \geq 69°$, $$fc=F8(\theta1)=8.3920\times10^{-5}\theta1^2-2.0490\times10^{-2}\theta1+2.1417 \quad (8)$$

According to the simulation results described above, the parameter ranges for geometry and orientation for the SAW device 128 of FIG. 10 may be selected to satisfy the inequality 1.07×fs≤fc, which may be rewritten as indicated below.

$$1.07 \times fs \leq fc$$

$$1.07 \times F5(\theta1,\theta2,h2,h3) \times F6(h1) \times F7(DF) \leq F8(\theta1)$$

As illustrated by the simulation results of FIG. 19H, the cut-off frequency fc is at a peak value when the rotation angle θ1 of the quartz carrier substrate 136 is about 69°. This result is unexpected considering a rotation angle of 66.31°, as previously demonstrated, includes the second fastest maximum of bulk acoustic velocity according to slowness curves for quartz, and would therefore be expected to have the second highest maximum of fc. In practice, a SAW device may be configured with the rotation angle of the Y-cut quartz carrier substrate (θ1), the rotation angle of the piezoelectric layer (θ2), the thickness of the IDT (h1), the thickness of the piezoelectric layer (h2), the thickness of the dielectric layer between the quartz carrier substrate and the piezoelectric layer (h3), and the duty factor (DF) of the IDT to satisfy the inequality 1.07×F5(θ1, θ2, h2, h3)×F6(h1)×

F7(DF)≤F8(θ1) and provide the second highest maximum of fc when the rotation angle is about 69°. In some embodiments, a SAW device with a higher fc is more important than having the second fastest maximum of bulk acoustic velocity. In this regard, in some embodiments, a SAW device includes a quartz carrier substrate with a plane obtained by rotating a Y-cut substrate 69° along the X axis. Some deviation from 69°, such as in a range of 68° to 70° may still provide a high fc.

As previously described, the rotation angle may have a larger deviation, such as up to about 10° and still provide improved performance parameters. In that manner, in some embodiments, a SAW device includes a quartz carrier substrate comprising a crystalline orientation in a range of 59° to 79° rotated Y-cut with a 75° to 105° X-propagation direction range. In some embodiments, the Y-cut rotation may comprise a range of 66° to 72°. In some embodiments, the X-propagation direction may comprise a range of 80° to 100°. In some embodiments, the X-propagation direction may comprise 90°.

In some embodiments, the IDT electrodes 130 of FIG. 18 may comprise Al, alloys of Al such as aluminum-copper (Al—Cu) alloys, or multiple layers such as a layer of Titanium (Ti) followed by a layer of an Al—Cu alloy. In some embodiments, at least one IDT electrode comprises a thickness less than about 0.15λ. In some embodiments, at least one IDT electrode comprises a thickness less than about 0.14λ. In further embodiments, at least one IDT electrode comprises a thickness in a range of from 0.03λ to about 0.14λ. For the functions described above for FIGS. 19A-19H, simulations were conducted where the IDT electrodes 130 comprise Al with a center value for the thickness h1 of 0.1λ. For embodiments where the IDT electrodes 130 comprise an Al—Cu alloy or a layer of Ti followed by a layer of Al—Cu alloy, h1 may be converted as follows. For an electrode of Al, h1 may be characterized according to the following relationship:

$$Mass \propto \rho 1 \times ha$$

$$h1 = \rho 1 \times ha / \rho 1 = ha$$

where ρ1 is the mass density of Al and ha is the thickness of the Al electrode. Accordingly, h1 is equal to the thickness of the Al electrode. For an electrode comprising a layer of Al—Cu alloy, h1 may be converted according to the following relationship:

$$Mass \propto \rho 2 \times hb$$

$$h1 = \rho 2 \times hb / \rho 1$$

where ρ1 is the mass density of Al, ρ2 is the mass density of the Al—Cu alloy, and hb is the thickness of the Al electrode. For an electrode comprising a layer of Ti followed by a layer of Al—Cu alloy, h1 may be converted according to the following relationship:

$$Mass \propto \rho 2 \times hc + \rho 3 \times hd$$

$$h1 = (\rho 2 \times hc + \rho 3 \times hd) / \rho 1$$

where ρ1 is the mass density of Al, ρ2 is the mass density of the Al—Cu alloy, ρ2 is the mass density of Ti, hc is the thickness of the Al—Cu layer, and hd is the thickness of the Ti layer.

Those skilled in the art will recognize improvements and modifications to the preferred embodiments of the present disclosure. All such improvements and modifications are considered within the scope of the concepts disclosed herein and the claims that follow.

What is claimed is:

1. A Surface Acoustic Wave (SAW) device, comprising:
   a quartz carrier substrate;
   a piezoelectric layer on a surface of the quartz carrier substrate; and
   at least one Interdigitated Transducer (IDT) on a surface of the piezoelectric layer opposite the quartz carrier substrate;
   wherein the quartz carrier substrate comprises a cut plane obtained by rotating a Y-cut quartz substrate in a range of 55° to 80° along an X axis and a propagation direction is obtained by rotating the X axis in a range of 75° to 105° in the cut plane;
   wherein a crystalline orientation of the cut plane is rotated along the propagation direction in a range of 0° to 30°, or in a range of 150° to 210°, or in a range of 330° to 360°.

2. The SAW device of claim 1 wherein the cut plane is obtained by rotating the Y-cut quartz substrate in a range of 60° to 80° along the X axis.

3. The SAW device of claim 1 wherein the cut plane is obtained by rotating the Y-cut quartz substrate in a range of 65° to 80° along the X axis.

4. The SAW device of claim 1 wherein the cut plane is obtained by rotating the Y-cut quartz substrate by 66.31° along the X axis.

5. The SAW device of claim 1 wherein the cut plane is obtained by rotating the Y-cut quartz substrate by 69° along the X axis.

6. The SAW device of claim 1 wherein the propagation direction is obtained by rotating the X axis in a range of 80° to 100°.

7. The SAW device of claim 1 wherein the propagation direction is obtained by rotating the X axis in a range of 87° to 93°.

8. The SAW device of claim 1 wherein a thickness of the piezoelectric layer is less than two times an IDT period of the at least one IDT.

9. The SAW device of claim 1 wherein a thickness of the piezoelectric layer is less than one times an IDT period of the at least one IDT.

10. The SAW device of claim 1 wherein a thickness of the piezoelectric layer is less than about seventy percent of an IDT period of the at least one IDT.

11. The SAW device of claim 1 wherein the at least one IDT comprises Aluminum or an Aluminum alloy.

12. The SAW device of claim 1 wherein a thickness of the at least one IDT is less than about fifteen percent of an IDT period.

13. The SAW device of claim 1 wherein a thickness of the at least one IDT is in a range of from three percent to fourteen percent of an IDT period.

14. The SAW device of claim 1 wherein the piezoelectric layer comprises Lithium Tantalate with an orientation between Y and Y+60°.

15. The SAW device of claim 1 wherein the piezoelectric layer comprises Lithium Niobate with an orientation between Y−20° and Y+60°.

16. The SAW device of claim 1 further comprising one or more layers on the surface of the quartz carrier substrate between the quartz carrier substrate and the piezoelectric layer.

17. The SAW device of claim 16 wherein the one or more layers comprise at least one layer of Silicon Oxide.

18. The SAW device of claim 17 wherein the Silicon Oxide is doped with a dopant containing Fluoride or Boron atoms.

19. The SAW device of claim 1 wherein the at least one IDT is embedded inside one or more dielectric layers.

20. The SAW device of claim 19 wherein the one or more dielectric layers comprise Silicon Oxide.

21. The SAW device of claim 20 wherein the Silicon Oxide is doped with a dopant containing Fluoride or Boron atoms.

22. The SAW device of claim 1 wherein a cut-off frequency is at least 1.07 times greater than a resonance frequency.

23. The SAW device of claim 1 wherein a bulk acoustic velocity of the quartz carrier substrate in the propagation direction is larger than a velocity of a SAW of the SAW device.

24. The SAW device of claim 1 wherein the propagation direction comprises a second fastest maximum of slow shear velocity of the quartz carrier substrate.

25. A Surface Acoustic Wave (SAW) device, comprising:
a quartz carrier substrate;
a piezoelectric layer on a surface of the quartz carrier substrate; and
at least one Interdigitated Transducer (IDT) on a surface of the piezoelectric layer opposite the quartz carrier substrate;
wherein the quartz carrier substrate comprises a plane obtained by rotating a Y-cut quartz substrate in a range of 55° to 80° along an X axis and a propagation direction is obtained by rotating the X axis in a range of 75° to 105° in the plane;
wherein a rotation angle of the Y-cut quartz substrate ($\theta 1$), a rotation angle of the piezoelectric layer ($\theta 2$), a thickness of the at least one IDT ($h1$), a thickness of the piezoelectric layer ($h2$), a thickness of a dielectric layer between the quartz carrier substrate and the piezoelectric layer ($h3$), and a duty factor (DF) of the at least one IDT satisfy the inequality:

$$1.07 \times F5(\theta 1, \theta 2, h2, h3) \times F6(h1) \times F7(DF) \leq F8(\theta 1)$$

wherein:

$$F1(\theta 1) = -1.9118 \times 10^{-5}\theta 1^2 + 1.2926 \times 10^{-3}\theta 1 + 9.9800 \times 10^{-1}$$

$$F2(\theta 2) = 4.3337 \times 10^{-14}\theta 2^6 - 4.0011 \times 10^{-11}\theta 2^5 + 1.2031 \times 10^{-8}\theta 2^4 - 1.4033 \times 10^{-6}\theta 2^3 + 4.6659 \times 10^{-5}\theta 2^2 + 6.9837 \times 10^{-4}\theta 2 + 9.6029 \times 10^{-1}$$

$$F3(h3) = -8.0286 \times 10^{-1}h3^3 + 6.3578 \times 10^{-1}h3^2 - 2.1829 \times 10^{-1}h3 + 9.9982 \times 10^{-1}$$

$$F4(\theta 2) = -1.5897 \times 10^{-13}\theta 2^6 + 5.4976 \times 10^{-11}\theta 2^5 - 3.4318 \times 10^{-9}\theta 2^4 - 3.6252 \times 10^{-7}\theta 2^3 + 1.5352 \times 10^{-5}\theta 2^2 + 1.2964 \times 10^{-3}\theta 2 + 9.8834 \times 10^{-1}$$

$$F5(\theta 1, \theta 2, h2, h3) = \{F4(\theta 2) - F1(\theta 1)F2(\theta 2)F3(h3)\}\mathrm{Sign}\left(\sin\frac{h2 - 0.15}{0.55}\frac{\pi}{2}\right) \times \left|\sin\frac{h2 - 0.15}{0.55}\frac{\pi}{2}\right|^{0.8} + F1(\theta 1)F2(\theta 2)F3(h3)$$

When $h2 \geq 0.7\lambda$ $$F6(h1) = -5.6650h1^2 - 3.8177 \times 10^{-1}h1 + 1.0931$$

$$F7(DF) = 2.8222 \times 10^{-1}DF^2 - 3.7921 \times 10^{-1}DF + 1.1190$$

When $\theta 1 \leq 69°$, $$F8(\theta 1) = 1.1577 \times 10^{-4}\theta 1^2 - 8.5663 \times 10^{-3}\theta 1 + 1.1660$$

When $\theta 1 > 69°$, $$F8(\theta 1) = 8.3920 \times 10^{-5}\theta 1^2 - 2.0490 \times 10^{-2}\theta 1 + 2.1417.$$

26. The SAW device of claim 25 wherein a crystalline orientation of the plane is rotated along the propagation direction in a range of 0° to 30°, or in a range of 150° to 210°, or in a range of 330° to 360°.

* * * * *

UNITED STATES PATENT AND TRADEMARK OFFICE
CERTIFICATE OF CORRECTION

PATENT NO. : 11,742,826 B2
APPLICATION NO. : 17/530650
DATED : August 29, 2023
INVENTOR(S) : Shogo Inoue and Marc Solal Page 1 of 1

It is certified that error appears in the above-identified patent and that said Letters Patent is hereby corrected as shown below:

In the Specification

In Column 8, Line 32, replace ""Sola)");" with --"Solal");--.

In Column 17, after Line 21 in equation (1), replace "F1(01)" with --F1($\theta$1)--.

Signed and Sealed this
Twenty-sixth Day of September, 2023

Katherine Kelly Vidal
*Director of the United States Patent and Trademark Office*